US012696507B2

(12) United States Patent　　　　(10) Patent No.:　US 12,696,507 B2
Shimizu et al.　　　　　　　　　　(45) Date of Patent:　　Jul. 28, 2026

(54) METHOD FOR MANUFACTURING SEMICONDUCTOR DEVICE, SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Tatsuo Shimizu, Shinagawa (JP); Yukio Nakabayashi, Yokohama (JP); Toshihide Ito, Shibuya (JP); Chiharu Ota, Kawasaki (JP); Johji Nishio, Machida (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 688 days.

(21) Appl. No.: 17/823,096

(22) Filed: Aug. 30, 2022

(65) Prior Publication Data

US 2023/0197790 A1　　　Jun. 22, 2023

(30) Foreign Application Priority Data

Dec. 17, 2021　　(JP) ................................. 2021-205099

(51) Int. Cl.
H02P 27/06　　　　(2006.01)
H10D 62/13　　　　(2025.01)
　　　　　(Continued)
(52) U.S. Cl.
CPC ......... H10D 62/8325 (2025.01); H02P 27/06 (2013.01); H10D 62/157 (2025.01); H10D 62/393 (2025.01)
(58) Field of Classification Search
CPC ............. H10D 62/8325; H10D 62/157; H10D 62/393; H02P 27/06
See application file for complete search history.

(56) References Cited

U.S. PATENT DOCUMENTS 10,381,491　B1 *　8/2019　Shimizu .............. H10D 62/128
2002/0172774　A1　11/2002　Lipkin
　　　　　　(Continued)

FOREIGN PATENT DOCUMENTS

JP　　2005-328014　A　　11/2005
JP　　2011-254119　A　　12/2011
　　　　　(Continued)

OTHER PUBLICATIONS

Tachiki, K. et al. "Formation of high-quality SiC(0001)/SiO$_2$ structures by excluding oxidation process with H$_2$ etching before SiO2 deposition and high-temperature N$_2$annealing", Appl. Phys. Express 13, 121002, 2020. 5 pages.

(Continued)

*Primary Examiner* — Jeff W Natalini
*Assistant Examiner* — Ian Isaac Degrasse
(74) *Attorney, Agent, or Firm* — Oblon, McClelland, Maier & Neustadt, L.L.P.

(57)　　　　ABSTRACT

A method for manufacturing a semiconductor device of an embodiment includes performing first ion implantation of implanting aluminum (Al) into a silicon carbide layer in a first projected range and a first dose amount, performing second ion implantation of implanting carbon (C) into the silicon carbide layer in a second projected range and a second dose amount which is a dose amount equal to or more than 10 times the first dose amount, performing a first heat treatment of 1600° C. or more, performing an oxidation treatment of oxidizing the silicon carbide layer, performing an etching process of etching the silicon carbide layer in an atmosphere containing a hydrogen gas, forming a silicon oxide film on the silicon carbide layer, and forming a gate electrode on the silicon oxide film.

12 Claims, 27 Drawing Sheets

(51) Int. Cl.
H10D 62/17 (2025.01)
H10D 62/832 (2025.01)

(56) References Cited

U.S. PATENT DOCUMENTS

| | | | |
|---|---|---|---|
| 2008/0146004 A1* | 6/2008 | Matocha | H10P 30/22 |
| | | | 438/478 |
| 2014/0209927 A1 | 7/2014 | Nishio et al. | |
| 2015/0044840 A1 | 2/2015 | Kobayashi et al. | |
| 2016/0005605 A1 | 1/2016 | Nishio et al. | |
| 2016/0027879 A1* | 1/2016 | Nishiguchi | C30B 23/02 |
| | | | 257/77 |
| 2016/0087044 A1 | 3/2016 | Iijima et al. | |
| 2016/0111499 A1 | 4/2016 | Hisamoto et al. | |
| 2018/0069081 A1 | 3/2018 | Nagasawa et al. | |
| 2018/0308936 A1* | 10/2018 | Shimizu | H10D 62/8325 |
| 2019/0157399 A1 | 5/2019 | Kosugi et al. | |
| 2019/0355820 A1* | 11/2019 | Wada | H10D 62/53 |
| 2020/0013907 A1* | 1/2020 | Furusho | H10D 62/60 |
| 2020/0091297 A1 | 3/2020 | Shimizu | |
| 2021/0151599 A1* | 5/2021 | Magri' et al. | H10D 62/235 |
| 2021/0296128 A1 | 9/2021 | Shimizu et al. | |
| 2022/0005925 A1 | 1/2022 | Shimizu et al. | |
| 2022/0302250 A1 | 9/2022 | Shimizu | |

FOREIGN PATENT DOCUMENTS

| | | | |
|---|---|---|---|
| JP | 2013-222933 A | 10/2013 | |
| JP | 2014-143248 A | 8/2014 | |
| JP | 2014-146748 A | 8/2014 | |
| JP | WO 2014/155651 A1 | 10/2014 | |
| JP | 2015-226030 A | 12/2015 | |
| JP | 2016-63122 A | 4/2016 | |
| JP | 2017-168671 A | 9/2017 | |
| JP | 2017-199922 A | 11/2017 | |
| JP | 2018-19069 A | 2/2018 | |
| JP | 2018-35051 A | 3/2018 | |
| JP | 2018-142653 A | 9/2018 | |
| JP | 2020-47668 A | 3/2020 | |
| JP | 2021-153168 A | 9/2021 | |
| JP | 2022-12282 A | 1/2022 | |
| JP | 2022-144216 A | 10/2022 | |
| WO | WO 2013/145022 A1 | 10/2013 | |

OTHER PUBLICATIONS

Tachiki, K. et al. "Mobility improvement of 4H-SiC(0001) MOSFETs by three-step process of $H_2$ etching, $SiO_2$ deposition, and interface nitridation", Appl. Phys. Express 14, 031001, 2021. 6 pages.
Japanese Office Action dated Jan. 27, 2026, issued in Japanese Patent Application No. 2025-072886 (with English translation).

* cited by examiner

FIG.5

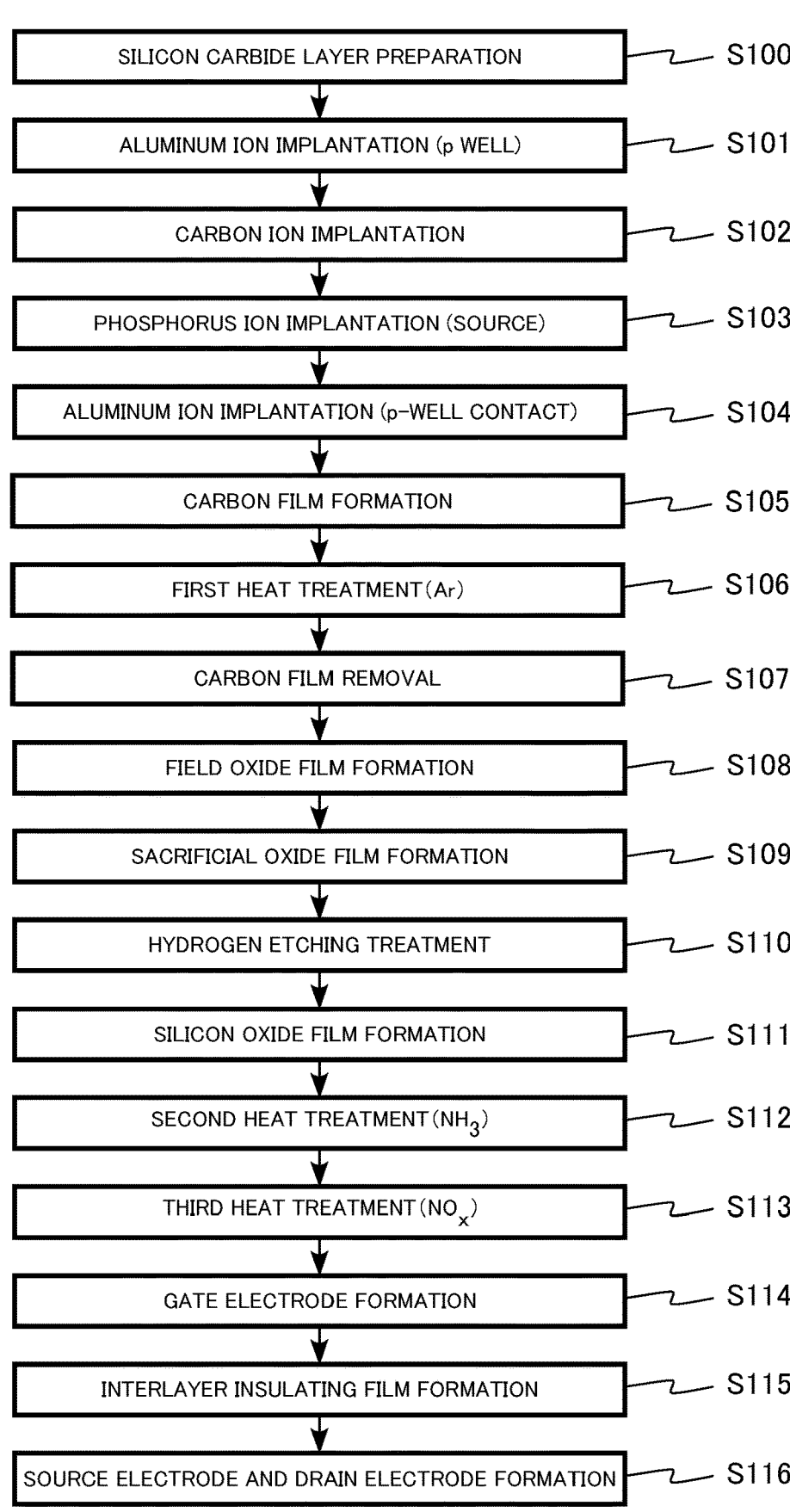

SILICON CARBIDE LAYER PREPARATION — S100

ALUMINUM ION IMPLANTATION (p WELL) — S101

CARBON ION IMPLANTATION — S102

PHOSPHORUS ION IMPLANTATION (SOURCE) — S103

ALUMINUM ION IMPLANTATION (p-WELL CONTACT) — S104

CARBON FILM FORMATION — S105

FIRST HEAT TREATMENT (Ar) — S106

CARBON FILM REMOVAL — S107

FIELD OXIDE FILM FORMATION — S108

SACRIFICIAL OXIDE FILM FORMATION — S109

HYDROGEN ETCHING TREATMENT — S110

SILICON OXIDE FILM FORMATION — S111

SECOND HEAT TREATMENT ($NH_3$) — S112

THIRD HEAT TREATMENT ($NO_x$) — S113

GATE ELECTRODE FORMATION — S114

INTERLAYER INSULATING FILM FORMATION — S115

SOURCE ELECTRODE AND DRAIN ELECTRODE FORMATION — S116

FIG.22

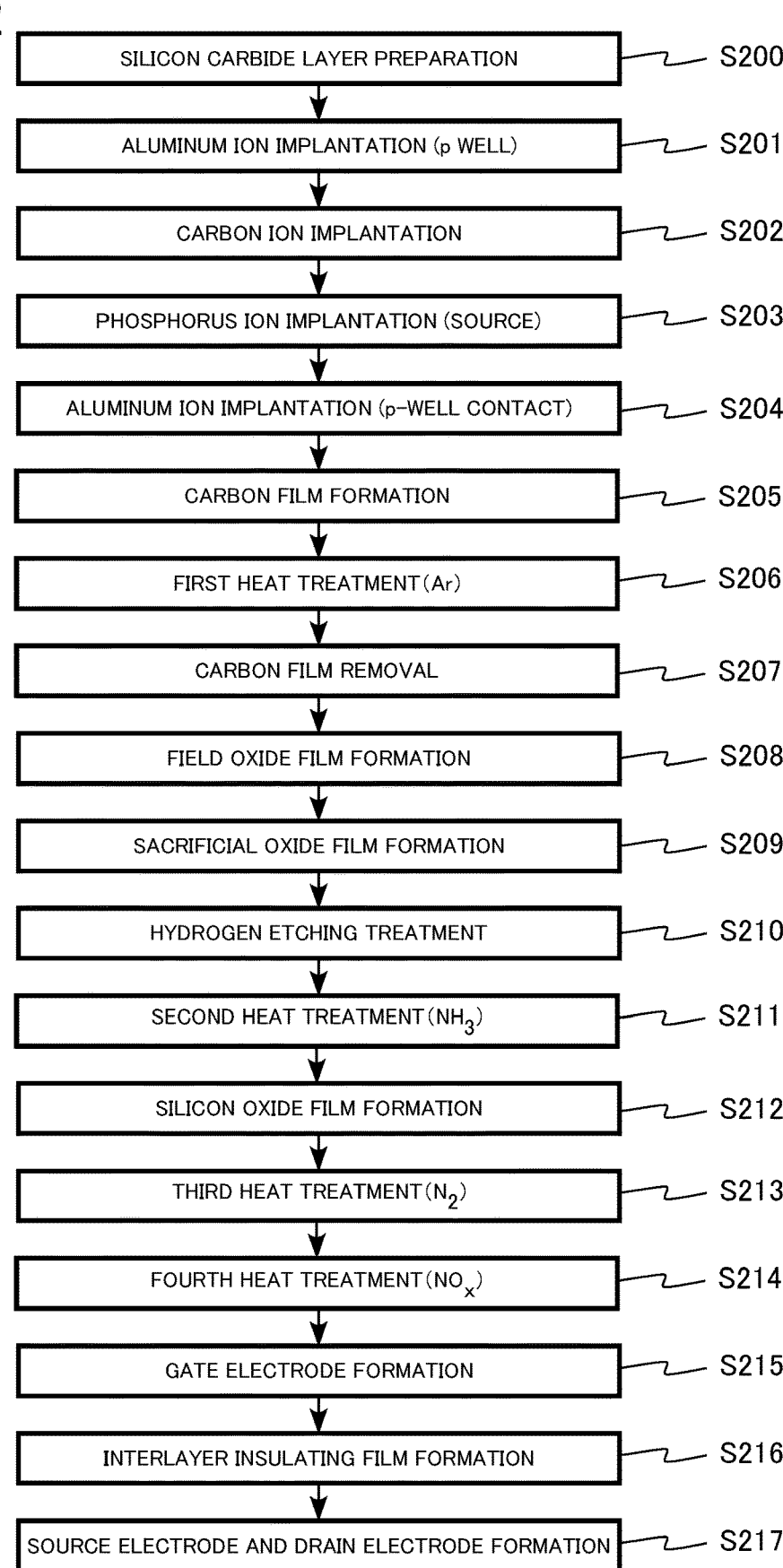

| | |
|---|---|
| SILICON CARBIDE LAYER PREPARATION | S200 |
| ALUMINUM ION IMPLANTATION (p WELL) | S201 |
| CARBON ION IMPLANTATION | S202 |
| PHOSPHORUS ION IMPLANTATION (SOURCE) | S203 |
| ALUMINUM ION IMPLANTATION (p-WELL CONTACT) | S204 |
| CARBON FILM FORMATION | S205 |
| FIRST HEAT TREATMENT (Ar) | S206 |
| CARBON FILM REMOVAL | S207 |
| FIELD OXIDE FILM FORMATION | S208 |
| SACRIFICIAL OXIDE FILM FORMATION | S209 |
| HYDROGEN ETCHING TREATMENT | S210 |
| SECOND HEAT TREATMENT ($NH_3$) | S211 |
| SILICON OXIDE FILM FORMATION | S212 |
| THIRD HEAT TREATMENT ($N_2$) | S213 |
| FOURTH HEAT TREATMENT ($NO_x$) | S214 |
| GATE ELECTRODE FORMATION | S215 |
| INTERLAYER INSULATING FILM FORMATION | S216 |
| SOURCE ELECTRODE AND DRAIN ELECTRODE FORMATION | S217 |

METHOD FOR MANUFACTURING SEMICONDUCTOR DEVICE, SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2021-205099, filed on Dec. 17, 2021, the entire contents of which are incorporated herein by reference.

FIELD

Embodiments described herein relate generally to a method for manufacturing a semiconductor device, a semiconductor device, an inverter circuit, a drive device, a vehicle, and an elevator.

BACKGROUND

Silicon carbide (SiC) is expected as a material for a next-generation semiconductor device. The silicon carbide has excellent physical properties such as a band gap of 3 times, a breakdown field strength of about 10 times, and a thermal conductivity of about 3 times those of silicon (Si). These characteristics are utilized, and thus, a semiconductor device capable of being operated at a high temperature with low loss can be realized.

For example, when a metal oxide semiconductor field effect transistor (MOSFET) is formed by using the silicon carbide, there is a problem that carrier mobility decreases or a threshold voltage fluctuates.

BRIEF DESCRIPTION OF THE DRAWINGS

FIG. 5 is a process flow diagram of a method for manufacturing a semiconductor device of the first embodiment;

FIG. 22 is a process flow diagram of a method for manufacturing a semiconductor device of a second embodiment;

DETAILED DESCRIPTION

Figure 1:
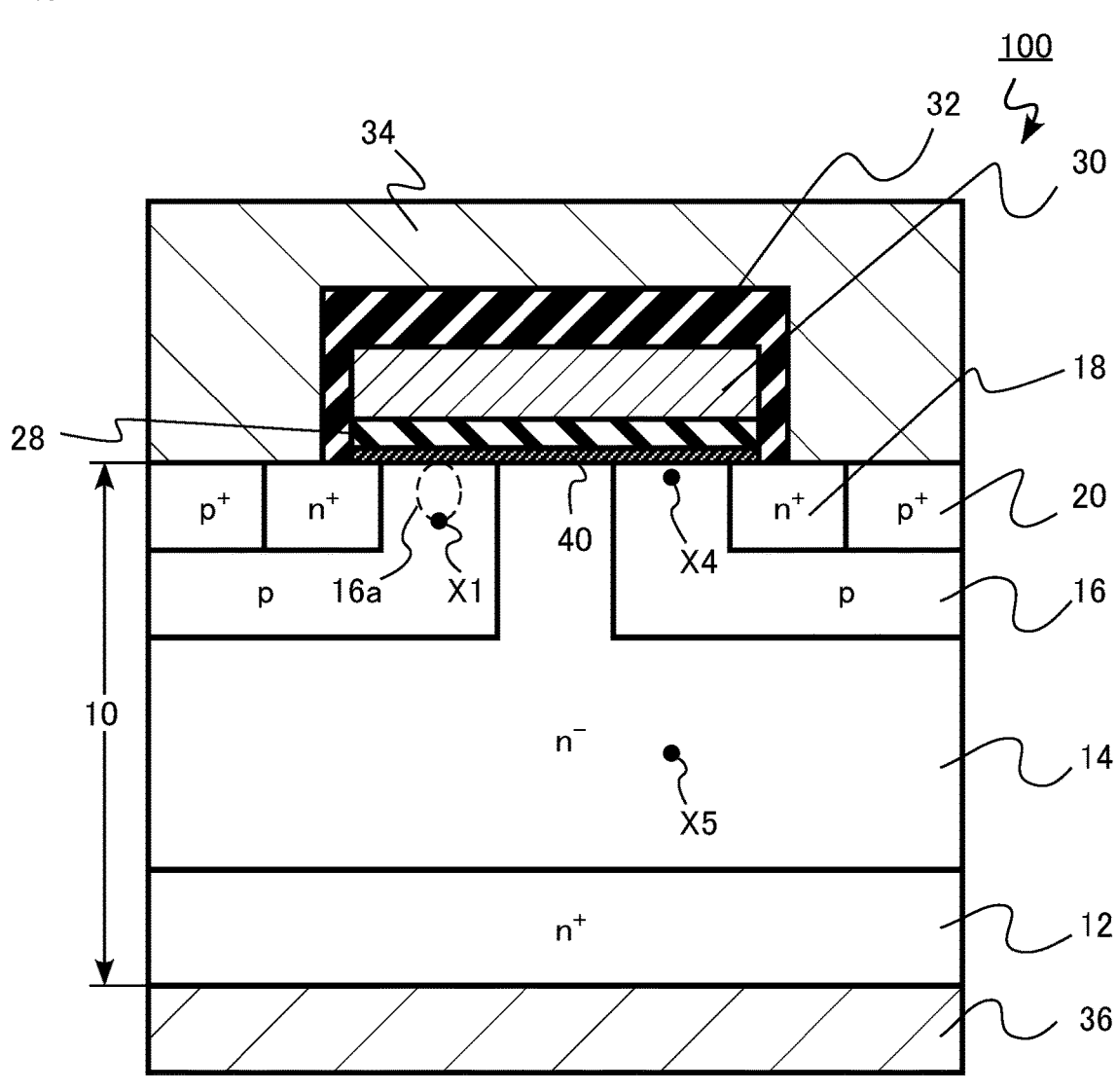
FIG. 1 is a schematic cross-sectional view of a semiconductor device of a first embodiment.

A method for manufacturing a semiconductor device of an embodiment includes performing first ion implantation of implanting aluminum (Al) into a silicon carbide layer in a first projected range and a first dose amount, performing second ion implantation of implanting carbon (C) into the silicon carbide layer in a second projected range and a second dose amount which is a dose amount equal to or more than 10 times the first dose amount, performing a first heat treatment of 1600° C. or more, performing an oxidation treatment of oxidizing the silicon carbide layer, performing an etching process of etching the silicon carbide layer in an atmosphere containing a hydrogen gas, forming a silicon oxide film on the silicon carbide layer, and forming a gate electrode on the silicon oxide film.

Hereinafter, embodiments of the present disclosure will be described with reference to the drawings. In the following description, the same or similar members will be denoted by the same reference numerals, and the description of the members once described will be appropriately omitted.

In the following description, when the notations of $n^+$, n, $n^-$, $p^+$, p, and $p^-$ are used, these notations indicate relative levels of impurity concentrations in conductivity types. That is, $n^+$ has an n-type impurity concentration relatively higher than n, and $n^-$ has an n-type impurity concentration relatively lower than n. $p^+$ has a p-type impurity concentration relatively higher than p, and p– has a p-type impurity concentration relatively lower than p. In some cases, $n^+$-type and $n^-$-type are simply referred to as n-type, and $p^+$-type and $p^-$-type are simply referred to as p-type. Unless otherwise specified, an impurity concentration of each region is represented by, for example, a value of the impurity concentration in a central portion of each region.

The impurity concentration can be measured by, for example, secondary-ion mass spectrometry (SIMS). The relative level of the impurity concentration can be determined from a level of a carrier concentration obtained by, for example, scanning capacitance microscopy (SCM). Distances such as a width and a depth of an impurity region can be obtained by, for example, SIMS. The distances such as a width and a depth of the impurity region can be obtained from, for example, an SCM image.

A depth of a trench, a thickness of an insulating layer, and the like can be measured, for example, on a profile of SIMS, an image of a transmission electron microscope (TEM), or an image of a scanning electron microscope (SEM).

A bonding state of a silicon atom, a carbon atom, a nitrogen atom, and an oxygen atom in the silicon carbide layer can be identified by using, for example, X-ray photoelectron spectroscopy (XPS method). The concentrations of various bonding states and the magnitude relationship of the concentrations can be determined by using, for example, X-ray photoelectron spectroscopy (XPS method).

First Embodiment

A semiconductor device of a first embodiment includes a silicon carbide layer, a gate electrode, a silicon oxide layer between the silicon carbide layer and the gate electrode, and a region that is disposed between the silicon carbide layer and the silicon oxide layer, and has a nitrogen concentration of $1 \times 10^{21}$ cm$^{-3}$ or more. Nitrogen concentration distributions in the silicon carbide layer, the silicon oxide layer, and the region have a peak in the region, in a portion between the silicon oxide layer and a first position 100 nm away from the silicon oxide layer toward the silicon carbide layer, a ratio of an intensity of infrared absorption of a wave number of 838 cm$^{-1}$, which is measured by an attenuated total reflection method (ATR method) in a Fourier transform infrared spectroscopy method (FTIR method), to an intensity of infrared absorption of a wave number of 970 cm$^{-1}$ is equal to or less than 1.0, a nitrogen concentration at a second position 1 nm away from the peak toward the silicon oxide layer is equal to or less than $1 \times 10^{18}$ cm$^{-3}$, and a carbon concentration at the second position is equal to or less than $1 \times 10^{18}$ cm$^{-3}$, and a nitrogen concentration at a third position 1 nm away from the peak toward the silicon carbide layer is equal to or less than $1 \times 10^{18}$ cm$^{-3}$.

FIG. 1 is a schematic cross-sectional view of the semiconductor device of the first embodiment. The semiconductor device is a MOSFET 100. The MOSFET 100 is a double implantation MOSFET (DIMOSFET) in which a p-well and a source region are formed by ion implantation. The MOSFET 100 is an n-channel MOSFET using electrons as carriers.

The MOSFET 100 includes a silicon carbide layer 10, a gate insulating layer 28 (silicon oxide layer), a gate electrode 30, an interlayer insulating film 32, a source electrode 34, a drain electrode 36, and an interface termination region 40 (region).

The silicon carbide layer 10 includes a drain region 12, a drift region 14 (first silicon carbide region), a p-well region 16 (second silicon carbide region), a source region 18, and a p-well contact region 20. The p-well region 16 has a channel portion 16a (portion).

The silicon carbide layer 10 is, for example, a single crystal 4H—SiC. The silicon carbide layer 10 is disposed between the source electrode 34 and the drain electrode 36.

Figure 2:
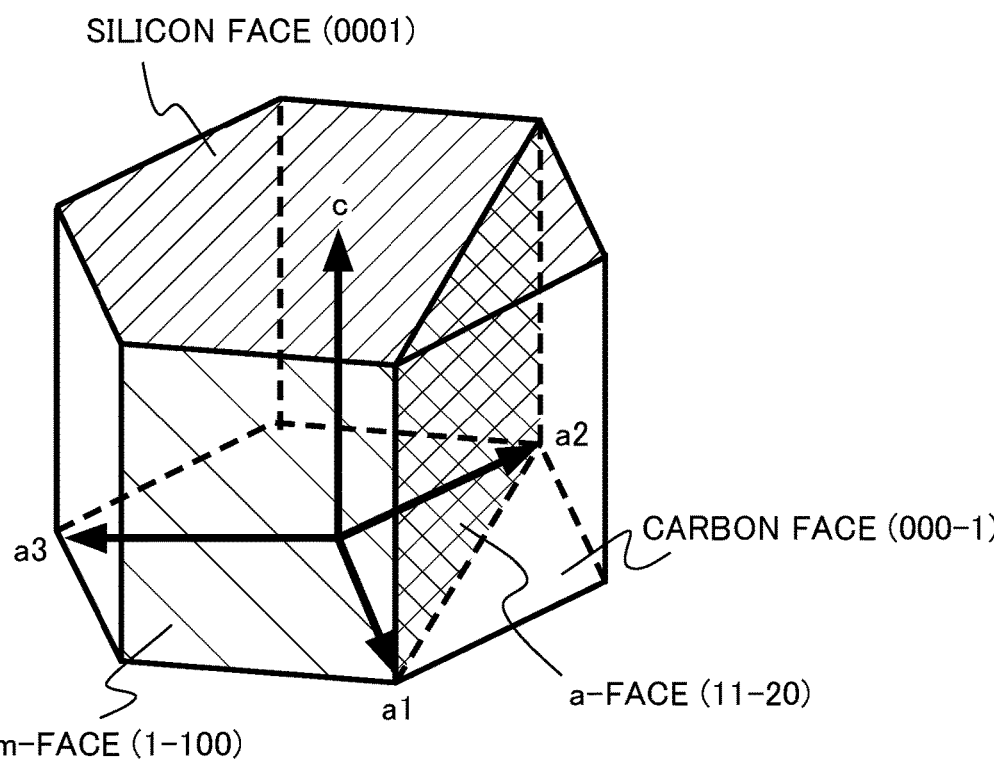
FIG. 2 is a diagram illustrating a crystal structure of a SiC semiconductor.

FIG. 2 is a diagram illustrating a crystal structure of a SiC semiconductor. A typical crystal structure of the SiC semiconductor is a hexagonal crystal system such as 4H—SiC. One of faces having a c-axis along an axial direction of a hexagonal prism as a normal line (top faces of the hexagonal prism) is a (0001) plane. A face equivalent to the (0001) plane is referred to as a silicon face (Si face) and is denoted as a {0001} plane. Silicon atoms (Si) are arrayed on an outermost surface of the silicon face.

The other of the faces having the c-axis along the axial direction of the hexagonal prism as the normal line (top faces of the hexagonal prism) is a (000-1) plane. A face equivalent to the (000-1) plane is referred to as a carbon face (C face) and is denoted as a {000-1} plane. Carbon atoms (C) are arrayed on an outermost surface of the carbon face.

On the other hand, a side surface (columnar surface) of the hexagonal prism is an m-face which is a face equivalent to a (1-100) plane, that is, a {1-100} plane. A face passing through a pair of ridgelines not adjacent to each other is an a-face which is a face equivalent to a (11-20) plane, that is, a {11-20} plane. Both silicon atoms (Si) and carbon atoms (C) are arrayed on outermost surfaces of the m-face and the a-face.

Hereinafter, an example in which a front surface of the silicon carbide layer 10 is a face inclined with respect to the silicon face at 0° or more and 8° or less, and a back surface is a face inclined with respect to the carbon face at 0° or more and 8° or less will be described. The front surface of the silicon carbide layer 10 has an off angle of 0° or more and 8° or less with respect to the silicon face.

The drain region 12 is $n^+$-type SiC. The drain region 12 contains, for example, nitrogen (N) as an n-type impurity. For example, an n-type impurity concentration of the drain region 12 is equal to or more than $1 \times 10^{18}$ cm$^{-3}$ and is equal to or less than $1 \times 10^{21}$ cm$^{-3}$.

The drift region 14 is provided on the drain region 12. The drift region 14 is $n^-$-type SiC. The drift region 14 contains, for example, nitrogen (N) as an n-type impurity.

An n-type impurity concentration of the drift region 14 is lower than the n-type impurity concentration of the drain region 12. For example, the n-type impurity concentration of the drift region 14 is equal to or more than $1 \times 10^{15}$ cm$^{-3}$ and is equal to or less than $2 \times 10^{16}$ cm$^{-3}$. The drift region 14 is, for example, an epitaxial growth layer of SiC formed on the drain region 12 by an epitaxial growth method.

For example, a thickness of the drift region 14 is equal to or more than 5 μm and is equal to or less than 100 μm.

The p-well region 16 is provided on a partial front surface of the drift region 14. The p-well region 16 is disposed between the drift region 14 and the gate insulating layer 28. The p-well region 16 is p-type SiC.

The p-well region 16 contains, for example, aluminum (Al) as a p-type impurity. For example, a p-type impurity concentration of the p-well region 16 is equal to or more than $1 \times 10^{16}$ cm$^{-3}$ and is equal to or less than $1 \times 10^{20}$ cm$^{-3}$.

For example, a depth of the p-well region 16 is equal to or more than 0.4 μm and is equal to or less than 0.8 μm. The p-well region 16 functions as a channel region of the MOSFET 100.

The channel portion 16a is disposed between the gate insulating layer 28 and a first position (X1 in FIG. 1) 100 nm away from the gate insulating layer 28 toward the silicon carbide layer 10. The channel portion 16a is disposed in the p-well region 16.

In the channel portion 16a, a ratio of an intensity of infrared absorption at a wave number of 838 cm$^{-1}$, which is measured by an attenuated total reflection method (ATR method) in a Fourier transform infrared spectroscopy method (FTIR method), to an intensity of infrared absorption at a wave number of 970 cm$^{-1}$ is equal to or less than 1.0.

In the channel portion 16a, a $Z_{1/2}$ level density measured by deep level transient spectroscopy (DLTS) is equal to or less than $1 \times 10^{11}$ cm$^{-3}$. A carbon vacancy density in the channel portion 16a is equal to or less than $1 \times 10^{11}$ cm$^{-3}$.

Hole mobility of electrons in the channel portion 16a is, for example, equal to or more than 200 cm$^2$/V·s. The hole mobility is mobility of electrons measured by Hall effect measurement.

The source region 18 is provided on a partial front surface of the p-well region 16. The source region 18 is n$^+$-type SiC. The source region 18 contains, for example, phosphorus (P) as an n-type impurity. For example, an n-type impurity concentration of the source region 18 is equal to or more than $1 \times 10^{18}$ cm$^{-3}$ and is equal to or less than $1 \times 10^{22}$ cm$^{-3}$.

A depth of the source region 18 is less than the depth of the p-well region 16. For example, the depth of the source region 18 is equal to or more than 0.2 μm and is equal to or less than 0.4 μm.

The p-well contact region 20 is provided on a partial front surface of the p-well region 16. The p-well contact region 20 is provided on a side of the source region 18. The p-well contact region 20 is p$^+$-type SiC.

The p-well contact region 20 contains, for example, aluminum (Al) as a p-type impurity. For example, a p-type impurity concentration of the p-well contact region 20 is equal to or more than $1 \times 10^{18}$ cm$^{-3}$ and is equal to or less than $1 \times 10^{22}$ cm$^{-3}$.

A depth of the p-well contact region 20 is less than the depth of the p-well region 16. The depth of the p-well contact region 20 is, for example, equal to or more than 0.2 μm and equal to or less than 0.4 μm.

The gate insulating layer 28 is provided between the silicon carbide layer 10 and the gate electrode 30. The gate insulating layer 28 is provided between the drift region 14 and the gate electrode 30, and between the p-well region 16 and the gate electrode 30. The gate insulating layer 28 is provided on the drift region 14 and the p-well region 16. The gate insulating layer 28 is continuously formed on the front surfaces of the drift region 14 and the p-well region 16.

The gate insulating layer 28 contains silicon oxide. The gate insulating layer 28 is an example of a silicon oxide layer.

A thickness of the gate insulating layer 28 is, for example, equal to or more than 30 nm and equal to or less than 100 nm. The gate insulating layer 28 functions as a gate insulating layer of the MOSFET 100.

The interface termination region 40 is disposed between the silicon carbide layer 10 and the gate insulating layer 28. The interface termination region 40 is disposed between the drift region 14 and the gate insulating layer 28, and between the p-well region 16 and the gate insulating layer 28. The interface termination region 40 contains nitrogen (N) as a termination element that terminates a dangling bond of the silicon carbide layer 10. The interface termination region 40 is an example of a region.

A concentration of nitrogen in the interface termination region 40 is, for example, equal to or more than $1 \times 10^{21}$ cm$^{-3}$.

Figure 3:
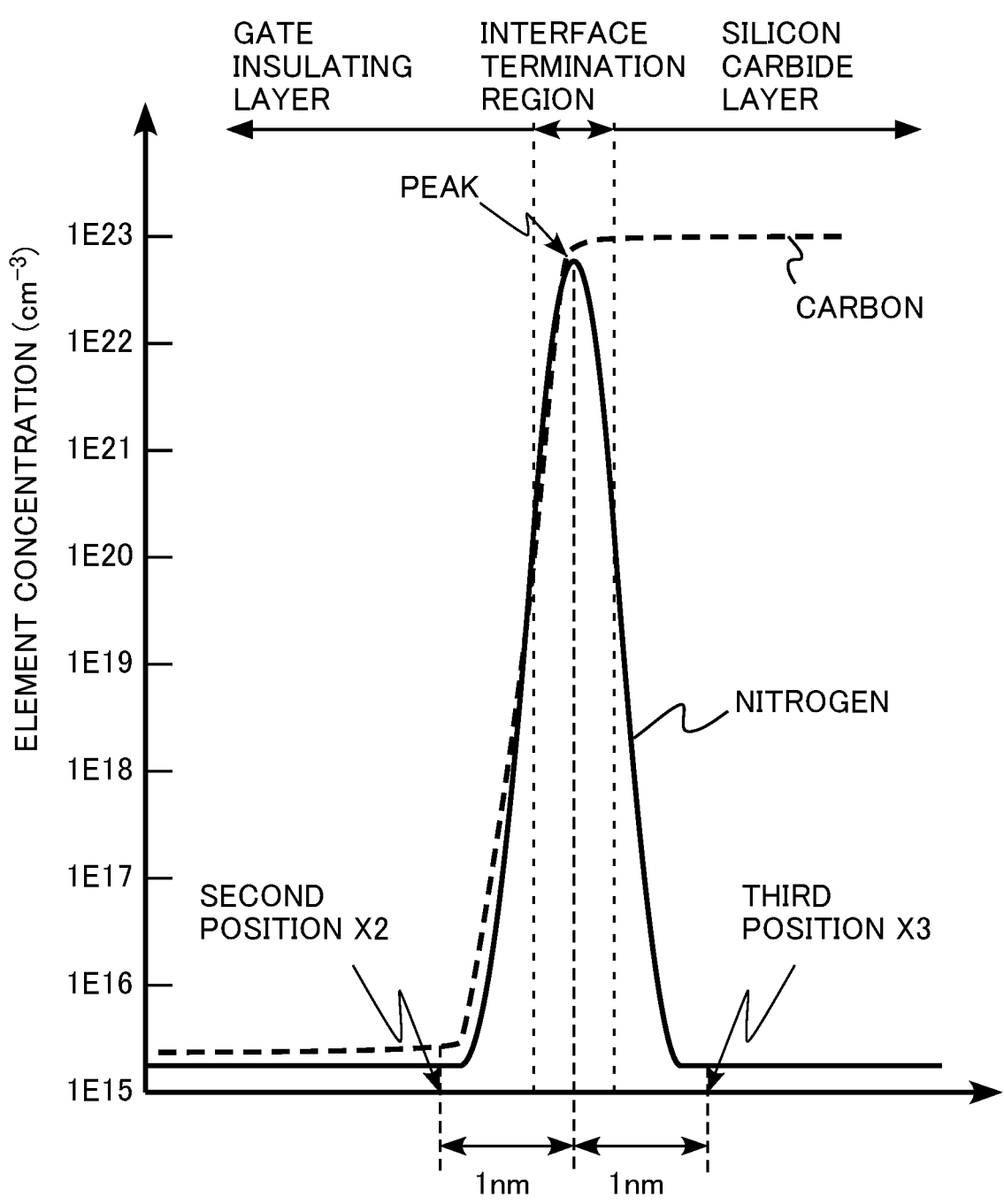
FIG. 3 is a diagram illustrating an element concentration distribution of the semiconductor device of the first embodiment.

FIG. 3 is a diagram illustrating an element concentration distribution of the semiconductor device of the first embodiment. FIG. 3 is a diagram illustrating element concentration distributions in the gate insulating layer 28, the interface termination region 40, and the silicon carbide layer 10. FIG. 3 illustrates concentration distributions of nitrogen and carbon.

A nitrogen concentration distribution has a peak in the interface termination region 40. A peak nitrogen concentration is, for example, equal to or more than $1 \times 10^{22}$ cm$^{-3}$. A full width at half maximum for a peak of the nitrogen concentration distribution is, for example, equal to or less than 1 nm. Nitrogen segregates at an interface between the silicon carbide layer 10 and the gate insulating layer 28.

A peak nitrogen concentration of the nitrogen concentration distribution is, for example, equal to or more than $1 \times 10^{21}$ cm$^{-3}$ and equal to or less than $4 \times 10^{23}$ cm$^{-3}$.

A nitrogen concentration at a second position (X2 in FIG. 3) 1 nm away from the peak of the nitrogen concentration distribution toward the gate insulating layer 28 is equal to or less than $1 \times 10^{18}$ cm$^{-3}$. A nitrogen concentration at a third position (X3 in FIG. 3) 1 nm away from the peak of the nitrogen concentration distribution toward the silicon carbide layer 10 is equal to or less than $1 \times 10^{10}$ cm$^{-3}$.

Figure 4A:
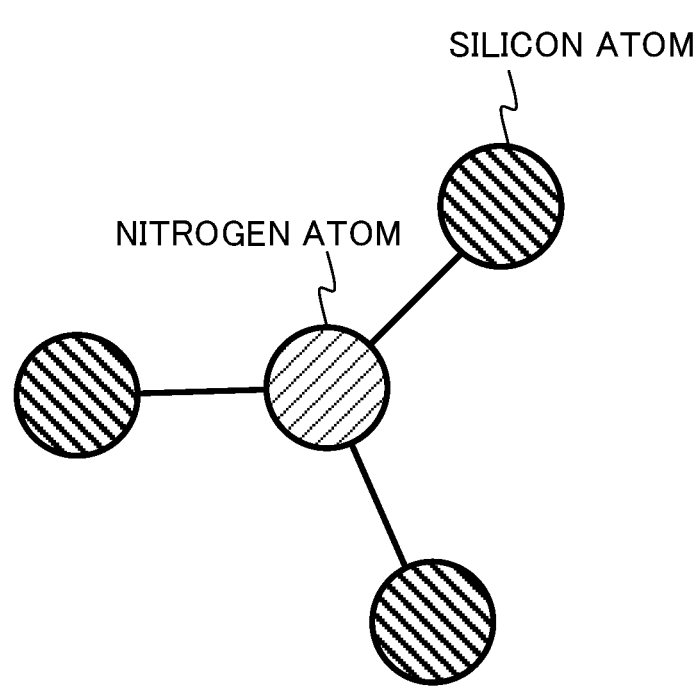
FIGS. 4A and 4B are schematic diagrams illustrating a bonding state of nitrogen atoms in the semiconductor device of the first embodiment.
Figure 4B:
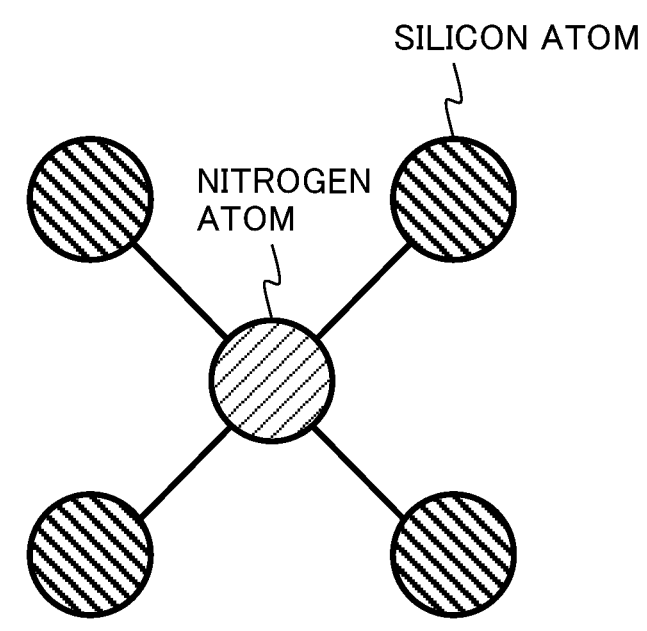

FIGS. 4A and 4B are schematic diagrams illustrating bonding states of nitrogen atoms in the semiconductor device of the first embodiment. FIG. 4A illustrates a case where the nitrogen atom is three-coordinated, and FIG. 4B illustrates a case where the nitrogen atom is four-coordinated.

In the case of the three-coordination illustrated in FIG. 4A, the nitrogen atom is bonded to three silicon atoms. In the case of the four-coordination illustrated in FIG. 4B, the nitrogen atom is bonded to four silicon atoms.

In the interface termination region 40, the amount of nitrogen atoms bonded to three silicon atoms is larger than the amount of nitrogen atoms bonded to four silicon atoms. In other words, in the interface termination region 40, the amount of three-coordinated nitrogen atoms is larger than the amount of four-coordinated nitrogen atoms.

For example, 90% or more of the nitrogen atoms present in the interface termination region 40 are the three-coordinated nitrogen atoms. A concentration of the three-coordinated nitrogen atoms is, for example, equal to or more than $1 \times 10^{21}$ cm$^{-3}$.

The three-coordinated nitrogen atoms present in the interface termination region 40 terminate a dangling bond on the front surface of the silicon carbide layer 10.

The nitrogen atoms in the interface termination region 40 substitute carbon atoms in an uppermost layer of the silicon carbide layer 10. The nitrogen atoms in the interface termination region 40 are bonded to the silicon carbide layer 10 in three-coordination. The nitrogen atom is present at a position of the carbon atom in the crystal structure of the silicon carbide. The silicon atoms of the silicon carbide layer 10 are three-coordinated to the nitrogen atoms.

The nitrogen atoms in the interface termination region 40 substitute carbon atoms of a bilayer constituting the uppermost layer of the silicon carbide layer 10. A termination element is finally bonded to the silicon carbide layer 10 in three-coordination. Excessive silicon atoms and carbon atoms are emitted from a side of the gate insulating layer 28 from the silicon carbide layer 10. The nitrogen atom is present at a position of the carbon atom in the crystal structure of the silicon carbide. A part of the silicon atoms of the outermost surface enters the gate insulating layer 28, and the nitrogen atoms are three-coordinated to the silicon atoms of the silicon carbide layer 10.

The nitrogen atoms present in a bulk of the silicon carbide layer 10 and substituting a carbon site of the crystal structure of the silicon carbide is four-coordinated. Since the four-coordinated nitrogen atoms function as n-type dopants, a threshold voltage of the MOSFET is reduced.

The concentration of the nitrogen atoms bonded to four silicon atoms at a third position X3 is equal to or less than $1 \times 10^{18}$ cm$^{-3}$. In other words, the concentration of the four-coordinated nitrogen atoms at the third position X3 is equal to or less than $1 \times 10^{18}$ cm$^{-3}$.

A carbon concentration distribution decreases from the interface termination region 40 toward the gate insulating layer 28. A carbon concentration at the second position X2 is equal to or less than $1 \times 10^{18}$ cm$^{-3}$.

A concentration of a complex defect of a carbon defect and a nitrogen defect including a carbon atom bonded to an oxygen atom and a nitrogen atom bonded to an oxygen atom at the second position X2 is, for example, equal to or less than $1 \times 10^{18}$ cm$^{-3}$.

The complex defect of the carbon defect and the nitrogen defect have a C—O—N bonding state. Carbon and nitrogen are formed by entering a silicon site of the silicon oxide of the gate insulating layer 28, and are adjacent to each other with one oxygen interposed therebetween.

This complex defect is formed when carbon and nitrogen are present in a large amount in a procedure of forming silicon oxide. Carbon enters an oxygen position of the silicon oxide, and thus, the carbon defect present alone is formed. Nitrogen enters an oxygen position of the silicon oxide, and thus, the nitrogen defect present alone is formed. Accordingly, the carbon defect and the nitrogen defect present alone can be removed by oxidation.

However, it is difficult to remove the complex defect by oxidation, and the complex defect remain in the silicon oxide to cause characteristic degradation of the MOSFET. In order to form silicon oxide having few complex defects, it is preferable to perform a manufacturing procedure in which extra carbon and extra nitrogen are not present together in the silicon oxide.

The amount of nitrogen atoms bonded to four silicon atoms at a fourth position (X4 in FIG. 1) 5 nm away from the gate insulating layer 28 toward the silicon carbide layer 10 is, for example, equal to or more than 80% and equal to or less than 120% of the amount of nitrogen atoms bonded to four silicon atoms at a fifth position (X5 in FIG. 1) 5 μm away from the gate insulating layer 28 toward the silicon carbide layer 10. In other words, the amount of nitrogen atoms four-coordinated at the fourth position X4 is equal to or more than 80% and equal to or less than 120% of the amount of nitrogen atoms four-coordinated at the fifth position X5.

A nitrogen concentration at the fourth position X4 is, for example, equal to or less than $1 \times 10^{18}$ cm$^{-3}$. A nitrogen concentration at the fifth position X5 is, for example, equal to or less than $1 \times 10^{18}$ cm j. The nitrogen concentration at the fourth position X4 is, for example, equal to or more than 80% and equal to or less than 120% of the nitrogen concentration at the fifth position X5.

The fourth position X4 is disposed, for example, in the p-well region 16. The fifth position X5 is disposed, for example, in the drift region 14.

The gate electrode 30 is provided on the gate insulating layer 28. The gate electrode 30 sandwiches the gate insulating layer 28 in cooperation with the silicon carbide layer 10. The gate electrode 30 sandwiches the gate insulating layer 28 in cooperation with the drift region 14. The gate electrode 30 sandwiches the gate insulating layer 28 in cooperation with the p-well region 16.

The gate electrode 30 is, for example, polycrystalline silicon containing a p-type impurity or an n-type impurity.

The interlayer insulating film 32 is formed on the gate electrode 30. The interlayer insulating film 32 is disposed between the gate electrode 30 and the source electrode 34. The interlayer insulating film 32 is, for example, a silicon oxide film.

The source electrode 34 is electrically connected to the source region 18 and the p-well contact region 20. The source electrode 34 also functions as a p-well electrode that applies an electric potential to the p-well region 16. The source electrode 34 is in contact with, for example, the source region 18 and the p-well contact region 20.

The source electrode 34 has, for example, a stacked structure of a barrier metal layer of nickel (Ni) and a metal layer of aluminum on the barrier metal layer. The barrier metal layer of nickel and the silicon carbide layer may react to form nickel silicide (NiSi, $Ni_2Si$, or the like). The barrier metal layer of nickel and the metal layer of aluminum may form an alloy by reaction.

The drain electrode 36 is provided on a side of the silicon carbide layer 10 opposite to the source electrode 34, that is, on a back surface side. The drain electrode 36 is electrically connected to the drain region 12. The drain electrode 36 is in contact with the drain region 12.

The drain electrode 36 is, for example, nickel. Nickel may react with the drain region 12 to form nickel silicide (NiSi, $Ni_2Si$, or the like).

In the first embodiment, the n-type impurity is, for example, nitrogen or phosphorus. Arsenic (As) or antimony (Sb) can also be applied as the n-type impurity.

In the first embodiment, the p-type impurity is, for example, aluminum. Boron (B), gallium (Ga), and indium (In) can also be applied as the p-type impurity.

Next, an example of the method for manufacturing a semiconductor device of the first embodiment will be described.

A method for manufacturing a semiconductor device of the first embodiment includes performing first ion implantation of implanting aluminum (Al) into a silicon carbide layer in a first projected range and a first dose amount, performing second ion implantation of implanting carbon (C) into the silicon carbide layer in a second projected range and a second dose amount which is a dose amount equal to or more than 10 times the first dose amount, performing a first heat treatment of 1600° C. or more, performing an oxidation treatment of oxidizing the silicon carbide layer, performing an etching process of etching the silicon carbide layer in an atmosphere containing a hydrogen gas, forming a silicon oxide film on the silicon carbide layer, and forming a gate electrode on the silicon oxide film. In the method for manufacturing a semiconductor device of the first embodiment, a second heat treatment is performed in an atmosphere containing nitrogen after the silicon oxide film is formed. The atmosphere is at least one atmosphere selected from the group consisting of a first atmosphere containing ammonia, a second atmosphere containing nitrogen gas and hydrogen gas, and a third atmosphere containing nitrogen gas and carbon dioxide gas.

Hereinafter, an example in which a second heat treatment is performed in a first atmosphere containing ammonia gas ($NH_3$) will be described.

FIG. 5 is a process flow diagram of the method for manufacturing a semiconductor device of the first embodiment. FIGS. 6, 7, 8, 9, 10, 11, 12, 13, 14, 15, 16, 17, 18, 19, and 20 are explanatory diagram illustrating the method for manufacturing a semiconductor device of the first embodiment. FIGS. 6, 7, 8, 10, 11, 12, 13, 14, 15, 16, 17, 18, 19, and 20 are cross-sectional views in the middle of manufacturing. FIG. 9 is a diagram illustrating an element distribution immediately after ion implantation.

As illustrated in FIG. 5, the method for manufacturing a semiconductor device of the first embodiment includes silicon carbide layer preparation (step S100), aluminum ion implantation (step S101), carbon ion implantation (step S102), phosphorus ion implantation (step S103), aluminum ion implantation (step S104), carbon film formation (step S105), a first heat treatment (step S106), carbon film removal (step S107), field oxide film formation (step S108), sacrificial oxide film formation (step S109), hydrogen etching process (step S110), silicon oxide film formation (step S111), a second heat treatment (step S112), a third heat treatment (step S113), gate electrode formation (step S114), interlayer insulating film formation (step S115), and source electrode and drain electrode formation (step S116).

Figure 6:
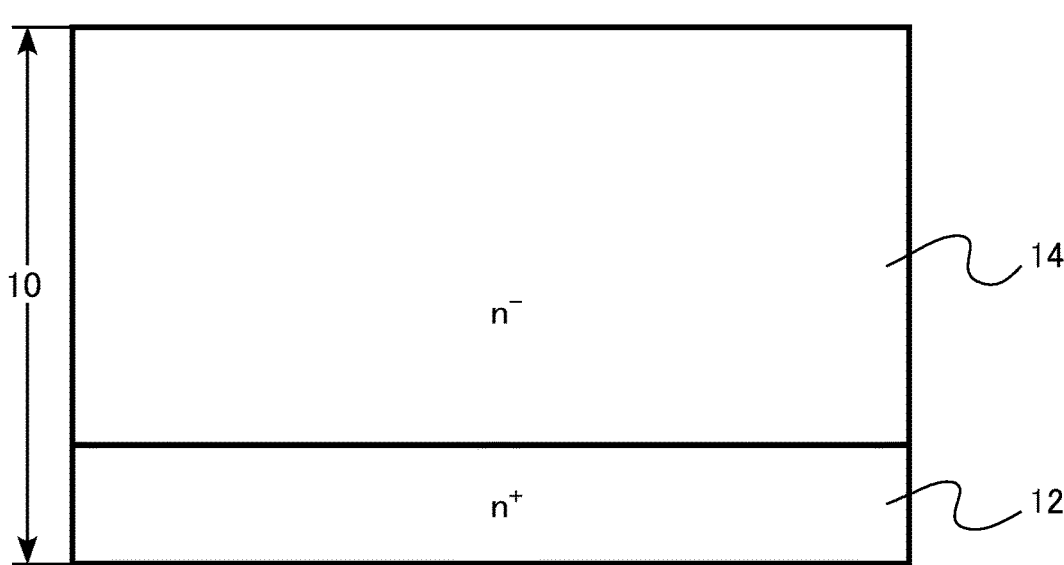
FIG. 6 is an explanatory diagram of the method for manufacturing a semiconductor device of the first embodiment.

In step S100, the silicon carbide layer 10 is prepared (FIG. 6). The silicon carbide layer 10 includes an $n^+$-type drain region 12 and an $n^-$-type drift region 14. The drift region 14 is formed on the drain region 12 by, for example, an epitaxial growth method.

The drain region 12 contains nitrogen as an n-type impurity. For example, an n-type impurity concentration of the drain region 12 is equal to or more than $1 \times 10^{18}$ cm$^{-3}$ and is equal to or less than $1 \times 10^{21}$ cm$^{-3}$.

The drift region 14 contains nitrogen as an n-type impurity. For example, the n-type impurity concentration of the drift region 14 is equal to or more than $1 \times 10^{15}$ cm$^{-3}$ and is equal to or less than $2 \times 10^{16}$ cm$^{-3}$. For example, a thickness of the drift region 14 is equal to or more than 5 μm and is equal to or less than 100 μm.

Figure 7:
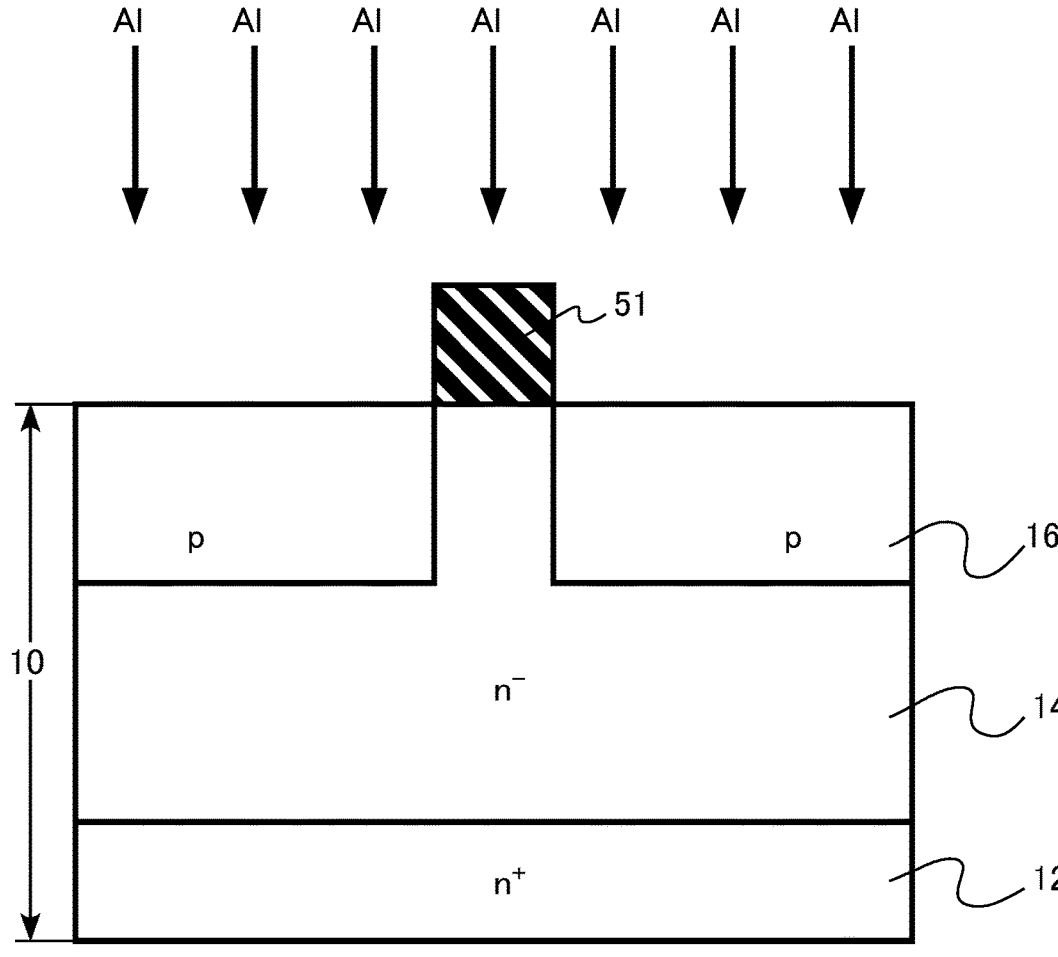
FIG. 7 is an explanatory diagram of the method for manufacturing a semiconductor device of the first embodiment.

In step S101, a first mask material 51 is formed by, for example, forming an insulating film and patterning the insulating film by photolithography and etching. Aluminum is ion-implanted into the drift region 14 by using the first mask material 51 as an ion implantation mask. The p-well region 16 is formed by ion implantation (FIG. 7).

Ion implantation for forming the p-well region 16 is an example of first ion implantation. Ion implantation of aluminum is performed in a first projected range and a first dose amount. The projected range is an average projection range.

The first projected range is, for example, equal to or more than 0.1 μm and equal to or less than 0.6 μm. The first dose amount is, for example, equal to or more than $1 \times 10^{12}$ cm$^{-2}$ and equal to or less than $1 \times 10^{14}$ cm$^{-2}$.

Figure 8:
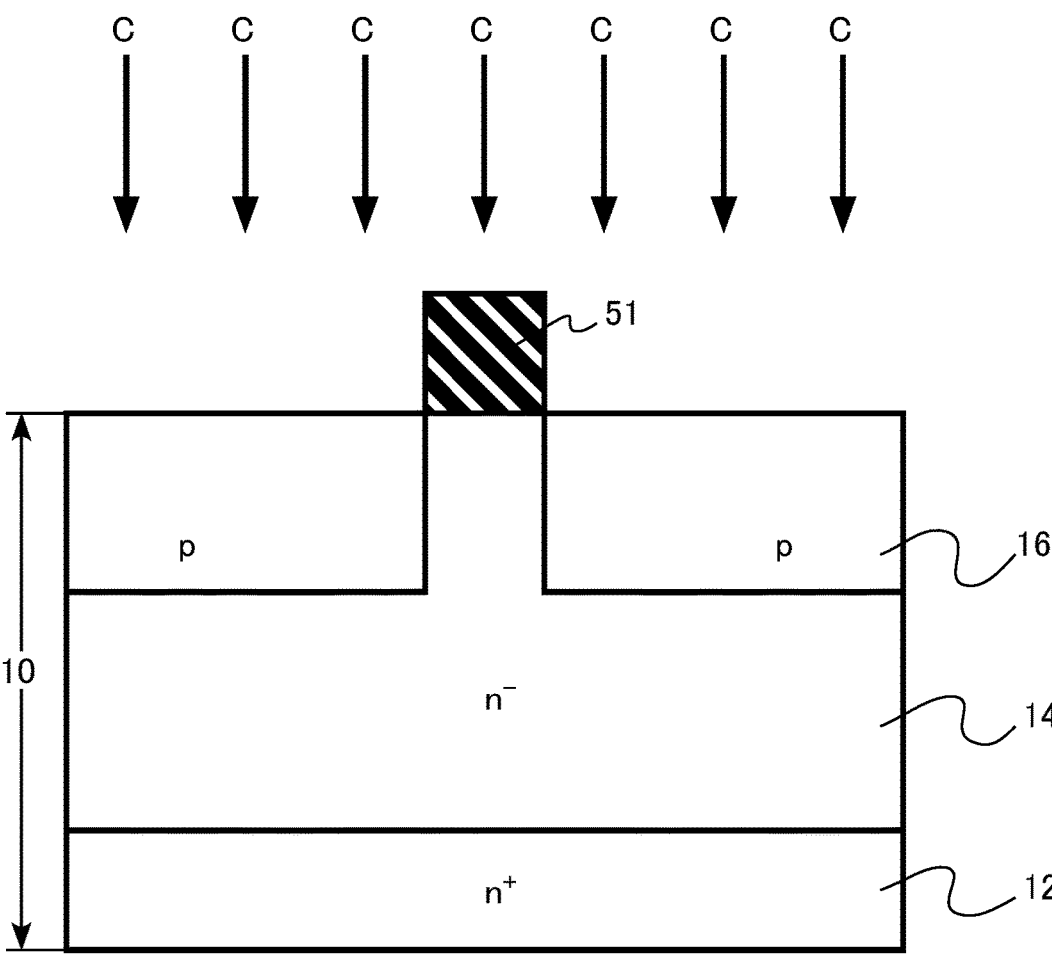
FIG. 8 is an explanatory diagram of the method for manufacturing a semiconductor device of the first embodiment.
Figure 9:
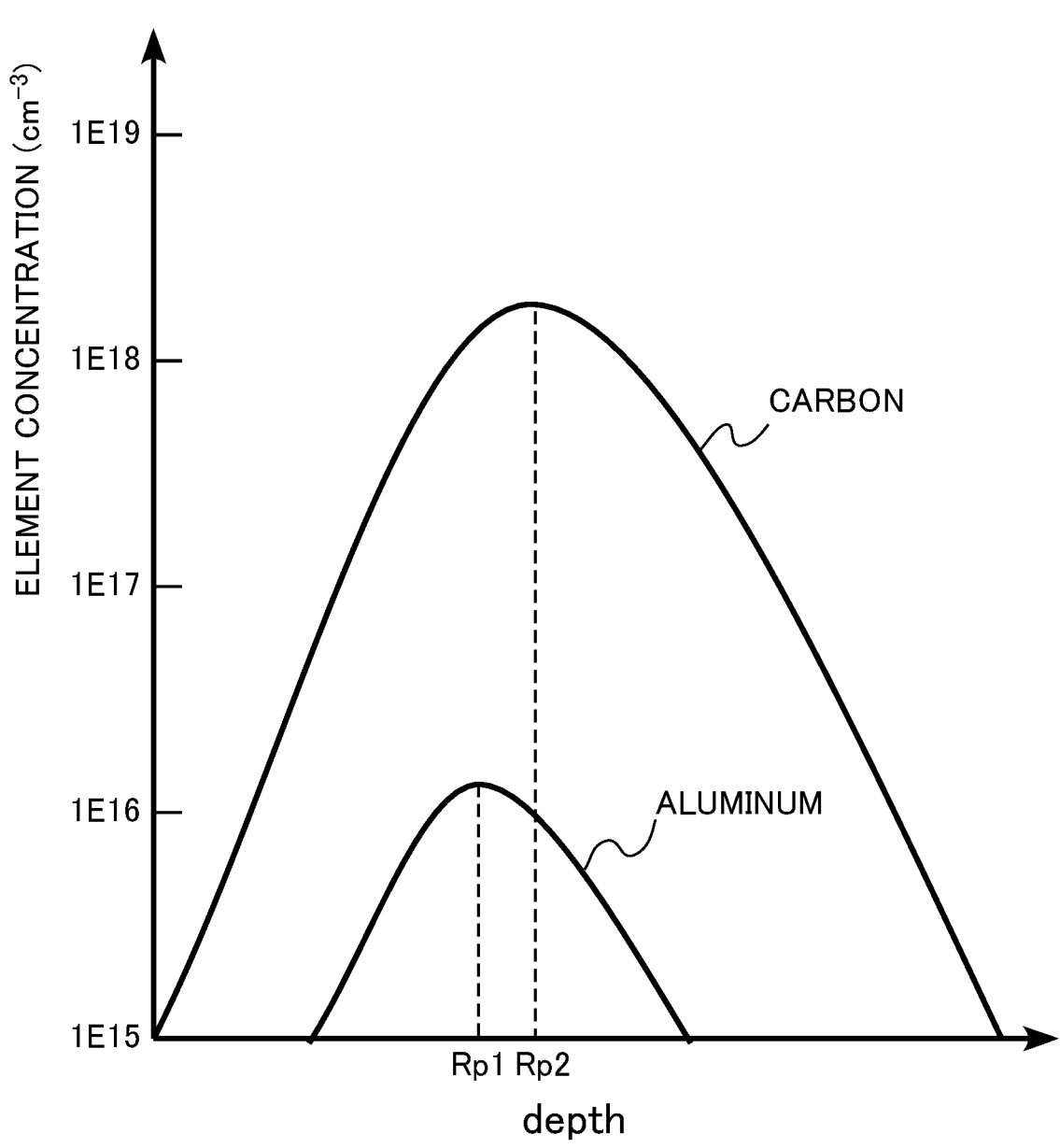
FIG. 9 is an explanatory diagram of the method for manufacturing a semiconductor device of the first embodiment.

In step S102, carbon is ion-implanted into the p-well region 16 by using the first mask material 51 as an ion implantation mask (FIG. 8). Ion implantation of carbon into the p-well region 16 is an example of second ion implantation. Ion implantation of carbon is performed in a second projected range and a second dose amount. Thereafter, the first mask material 51 is removed.

The second projected range is, for example, equal to or more than 0.1 μm and equal to or less than 0.6 μm. The second projected range is, for example, equal to or more than 80% and equal to or less than 120% of the first projected range. The second dose amount is equal to or more than 10 times the first dose amount. The second dose amount is, for example, equal to or less than 10,000 times the first dose amount. The second dose amount is, for example, equal to or more than $1 \times 10^{15}$ cm$^{-2}$ and equal to or less than $1 \times 10^{10}$ cm$^{-2}$.

FIG. 9 illustrates a concentration distribution of aluminum implanted into the silicon carbide layer 10 by the first ion implantation and a concentration distribution of carbon implanted into the silicon carbide layer 10 by the second ion implantation. FIG. 9 illustrates an element distribution immediately after ion implantation.

As illustrated in FIG. 9, a second projected range Rp2 of the ion implantation of carbon is disposed in the vicinity of a first projected range Rp1 of the ion implantation of aluminum. Since the second dose amount of the ion implantation of carbon is equal to or more than 10 times the first dose amount of the ion implantation of aluminum, the concentration distribution of carbon after the ion implantation completely covers, for example, the concentration distribution of aluminum after the ion implantation.

A peak concentration of the aluminum distribution is, for example, equal to or more than $1 \times 10^{16}$ cm$^{-3}$ and equal to or less than $1 \times 10^{20}$ cm$^{-3}$. A peak concentration of the carbon distribution is, for example, equal to or more than $1 \times 10^{18}$ cm$^{-3}$ and equal to or less than $1 \times 10^{22}$ cm$^{-3}$.

Figure 10:
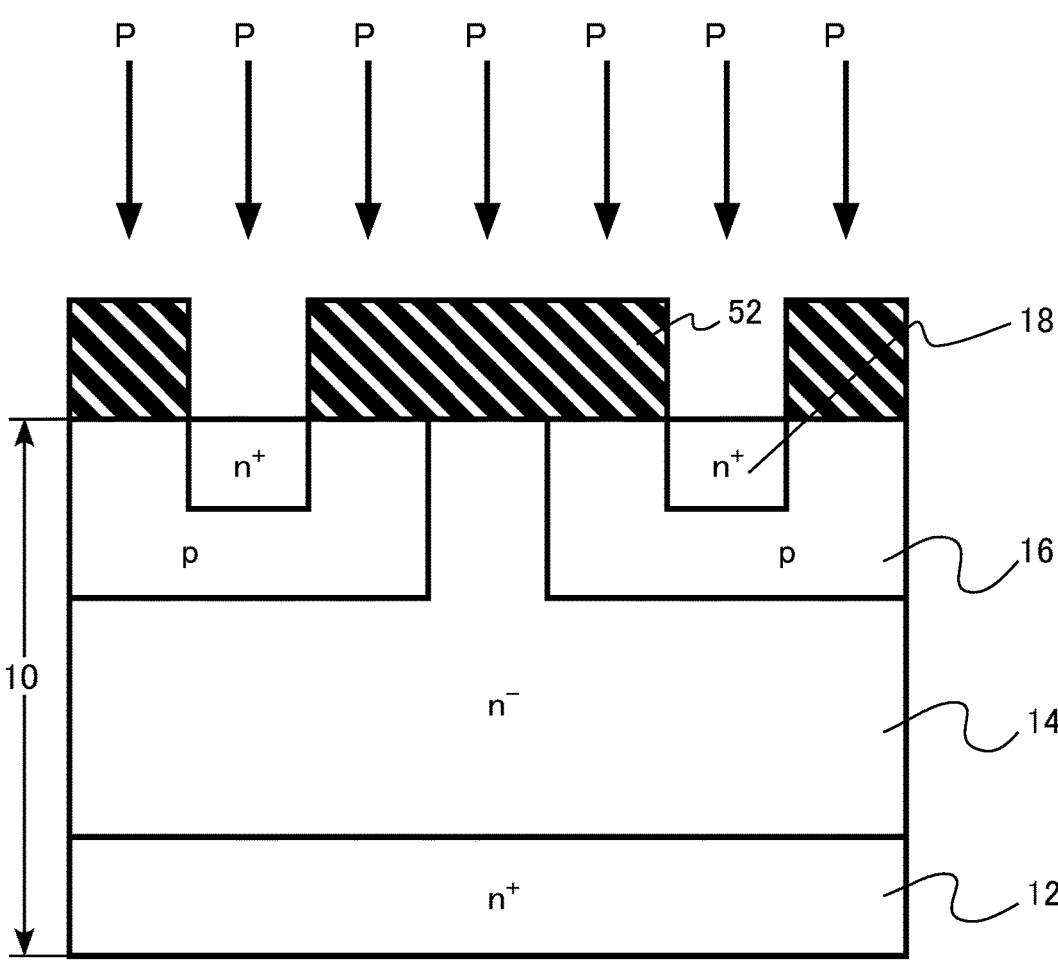
FIG. 10 is an explanatory diagram of the method for manufacturing a semiconductor device of the first embodiment.

In step S103, a second mask material 52 is formed by, for example, forming an insulating film and patterning the insulating film by photolithography and etching. Phosphorus (P) is ion-implanted into the drift region 14 by using the second mask material 52 as an ion implantation mask to form the source region 18 (FIG. 10). Thereafter, the second mask material 52 is removed.

Figure 11:
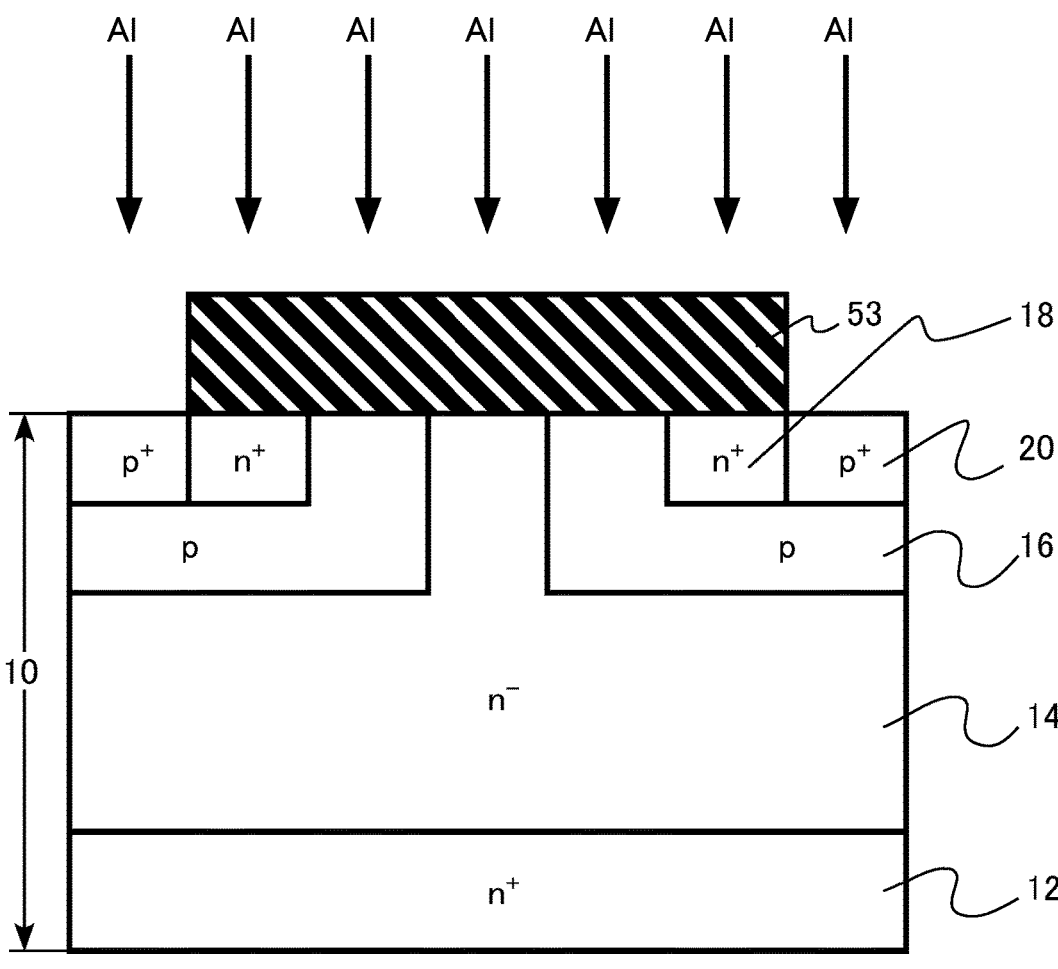
FIG. 11 is an explanatory diagram of the method for manufacturing a semiconductor device of the first embodiment.

In step S104, a third mask material 53 is formed by, for example, forming an insulating film and patterning the insulating film by photolithography and etching. Aluminum is ion-implanted into the drift region 14 by using the third mask material 53 as an ion implantation mask to form the p-well contact region 20 (FIG. 11).

Figure 12:
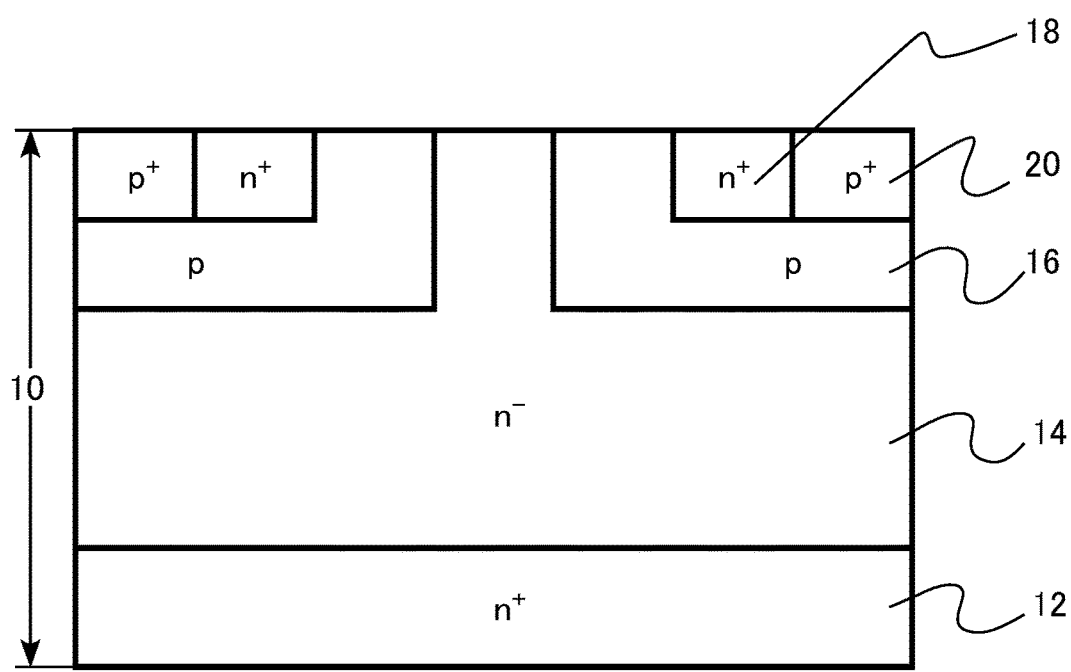
FIG. 12 is an explanatory diagram of the method for manufacturing a semiconductor device of the first embodiment.

Subsequently, the third mask material 53 is removed (FIG. 12).

Figure 13:
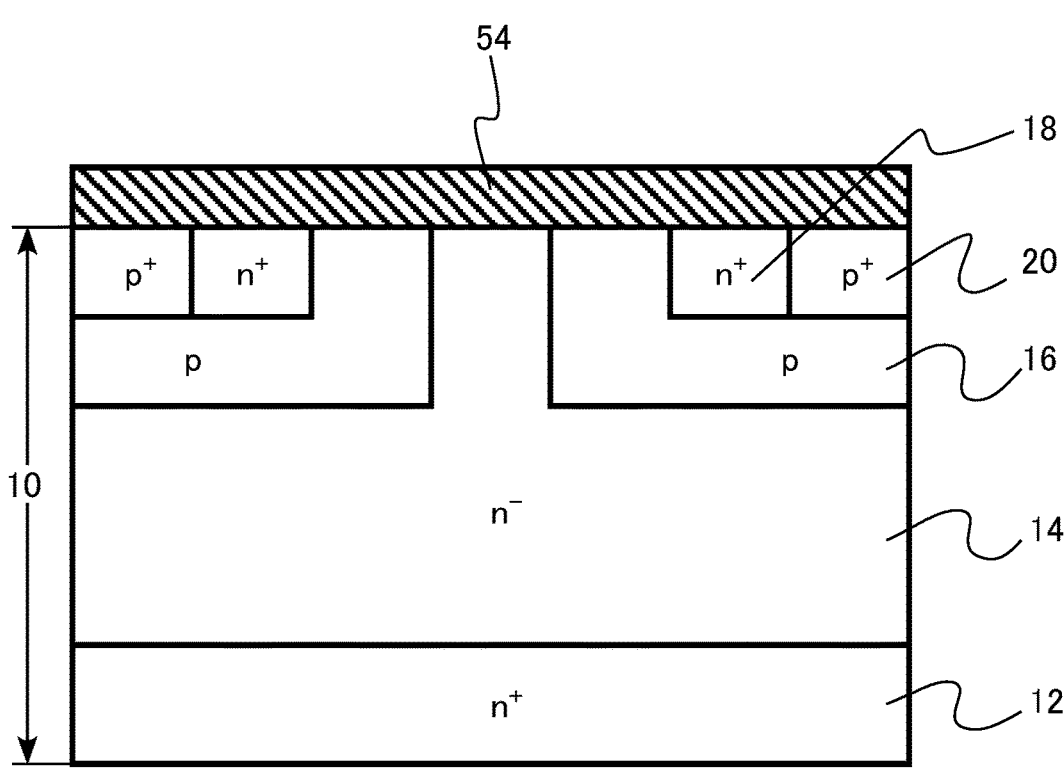
FIG. 13 is an explanatory diagram of the method for manufacturing a semiconductor device of the first embodiment.

In step S105, a carbon film 54 is formed on the silicon carbide layer 10 (FIG. 13).

In step S106, the first heat treatment is performed. The first heat treatment is performed at 1600° C. or more. The first heat treatment is performed, for example, at 2000° C. or less. The first heat treatment is performed in a non-oxidizing atmosphere. The first heat treatment is performed, for example, in an inert gas atmosphere. The first heat treatment is performed, for example, in an argon gas atmosphere.

By the first heat treatment, aluminum and phosphorus ion-implanted into the silicon carbide layer 10 are activated. The first heat treatment is activation annealing of aluminum and phosphorus. Interstitial carbon formed by carbon ion implantation into the silicon carbide layer 10 by the first heat treatment fills carbon vacancies in the silicon carbide layer 10.

The carbon film 54 suppresses desorption of silicon and carbon from the silicon carbide layer 10 into the atmosphere during the first heat treatment. The carbon film 54 absorbs excessive interstitial carbon in the silicon carbide layer 10 during the first heat treatment.

The first heat treatment includes, for example, a first step of 1600° C. or more and a second step at a temperature lower than in the first step. The second step is, for example, performed at 1000° C. or less.

For example, in the first step, aluminum and phosphorus ion-implanted into the silicon carbide layer 10 are activated, and interstitial carbon fills carbon vacancies. For example, in the second step of the low temperature, excessive interstitial carbon is expelled from the silicon carbide layer 10 and is absorbed by the carbon film 54.

Figure 14:
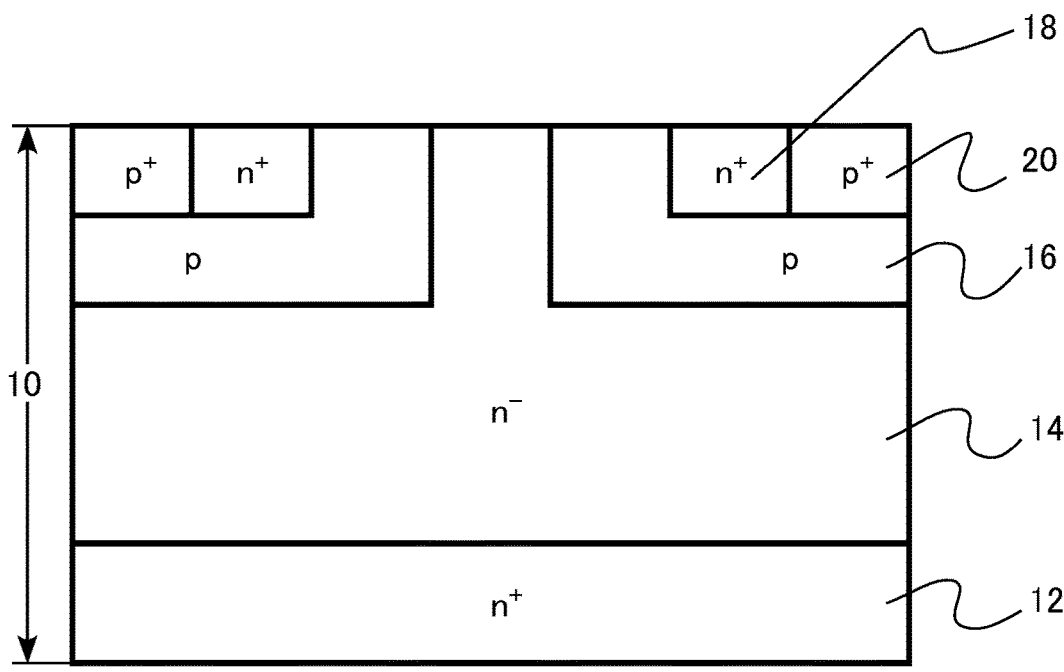
FIG. 14 is an explanatory diagram of the method for manufacturing a semiconductor device of the first embodiment.

In step S107, the carbon film 54 is removed (FIG. 14). The carbon film 54 is removed by an ashing treatment using oxygen plasma. The carbon film 54 is removed in the oxygen plasma.

During the ashing treatment using the oxygen plasma, the front surface of the silicon carbide layer 10 is oxidized.

The ashing treatment using the oxygen plasma is an example of an oxidation treatment.

Figure 15:
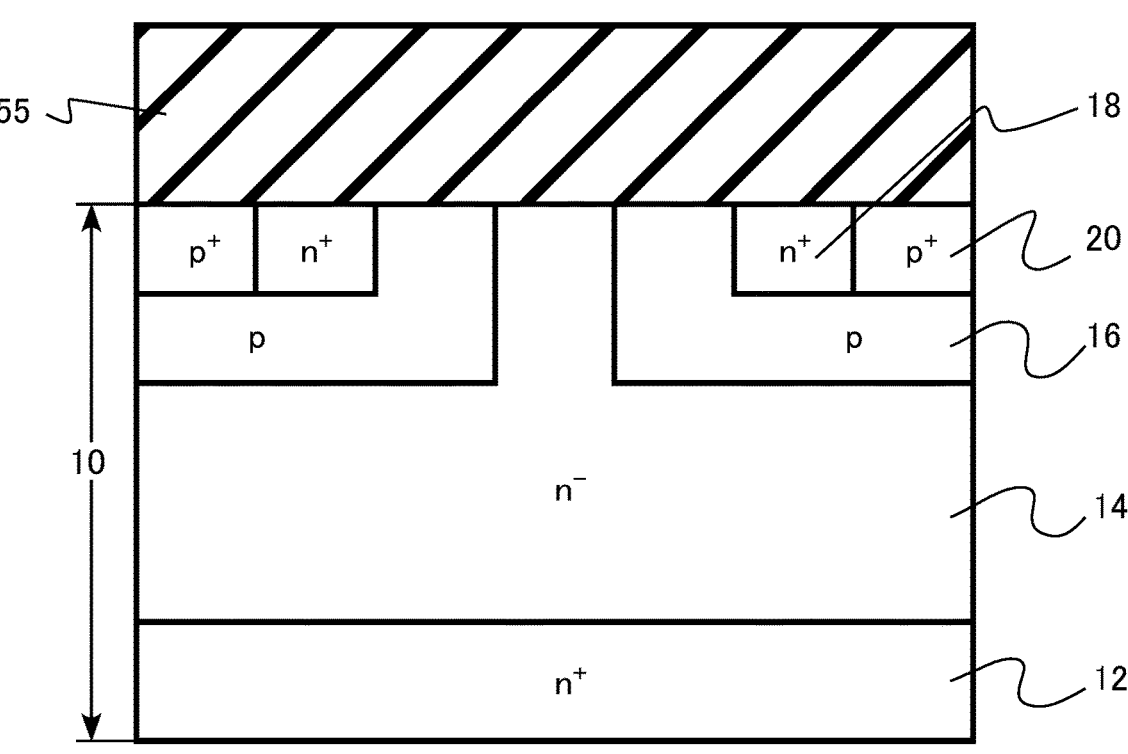
FIG. 15 is an explanatory diagram of the method for manufacturing a semiconductor device of the first embodiment.

In step S108, a field oxide film 55 is formed on the silicon carbide layer 10 (FIG. 15). The field oxide film 55 contains oxygen. The field oxide film 55 is, for example, a silicon oxide film. The field oxide film 55 is deposited by, for example, a vapor phase growth method. The field oxide film 55 is formed by, for example, a chemical vapor deposition method (CVD method) or a physical vapor deposition method (PVD method).

When the field oxide film 55 is deposited, the front surface of the silicon carbide layer 10 is oxidized. The deposition treatment of depositing the field oxide film 55 is an example of an oxidation treatment. The field oxide film 55 functions as an element isolation region in a peripheral region (not illustrated), for example.

Subsequently, the field oxide film 55 is removed. The field oxide film 55 is removed by using, for example, a wet etching method.

Figure 16:
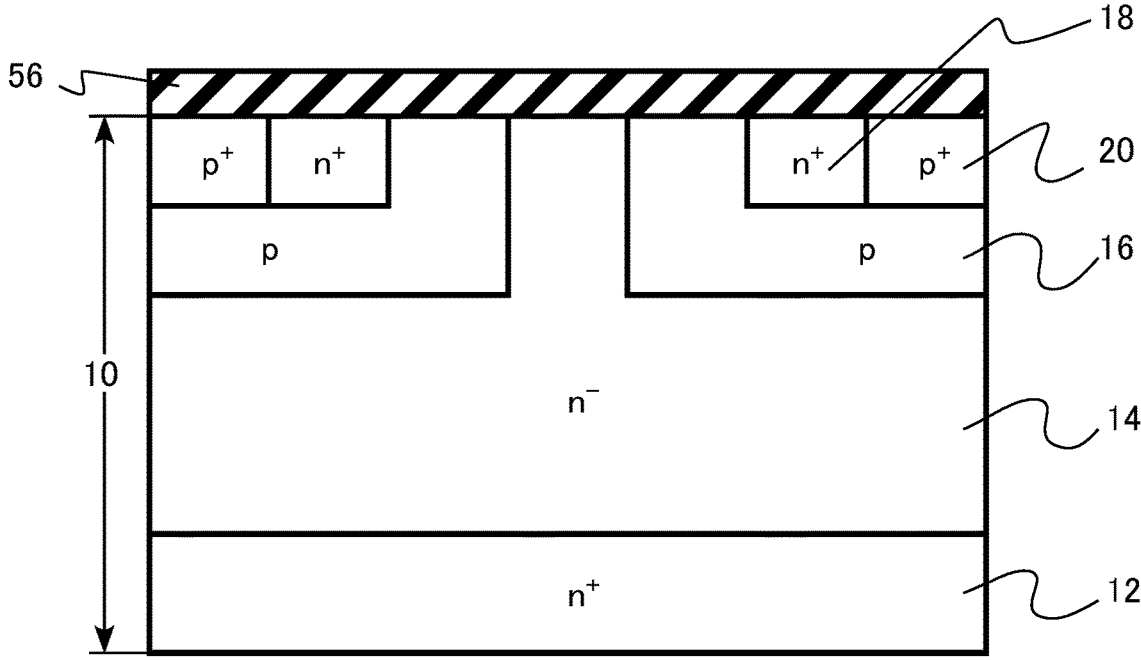
FIG. 16 is an explanatory diagram of the method for manufacturing a semiconductor device of the first embodiment.

In step S109, a sacrificial oxide film 56 is formed on the silicon carbide layer 10 (FIG. 16). The sacrificial oxide film 56 is, for example, a silicon oxide film. The sacrificial oxide film 56 is formed by thermal oxidation of the front surface of the silicon carbide layer 10.

When the sacrificial oxide film 56 is formed, the front surface of the silicon carbide layer 10 is oxidized. The thermal oxidation treatment of forming the sacrificial oxide film 56 is an example of an oxidation treatment. The sacrificial oxide film 56 is formed, and thus, for example, impurities and damage on the front surface of the silicon carbide layer 10 are removed.

Subsequently, the sacrificial oxide film 56 is removed. The sacrificial oxide film 56 is removed by using, for example, a wet etching method.

Figure 17:
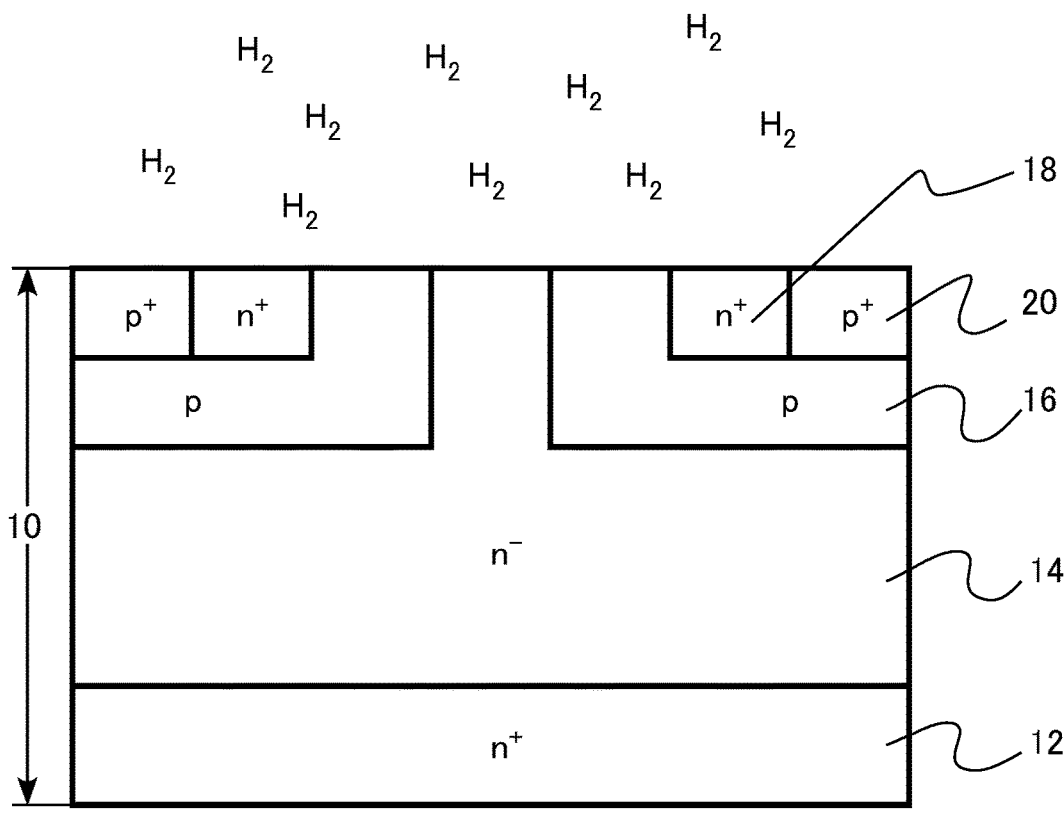
FIG. 17 is an explanatory diagram of the method for manufacturing a semiconductor device of the first embodiment.

In step S110, a hydrogen etching process of etching the front surface of the silicon carbide layer 10 in an atmosphere containing hydrogen gas is performed (FIG. 17). A temperature of the hydrogen etching process is, for example, equal to or more than 1300° C. and equal to or less than 1500° C. The front surface of the silicon carbide layer 10 is etched at a temperature, for example, equal to or more than 10 nm and equal to or less than 100 nm by the hydrogen etching process.

A partial pressure of the hydrogen gas in the atmosphere of the hydrogen etching process is, for example, equal to or more than 90%. The partial pressure of the hydrogen gas in the atmosphere of the hydrogen etching process is, for example, equal to or more than 95%. The partial pressure of the hydrogen gas in the atmosphere of the hydrogen etching process is, for example, 100%. The atmosphere of the hydrogen etching process may include, for example, argon gas.

Figure 18:
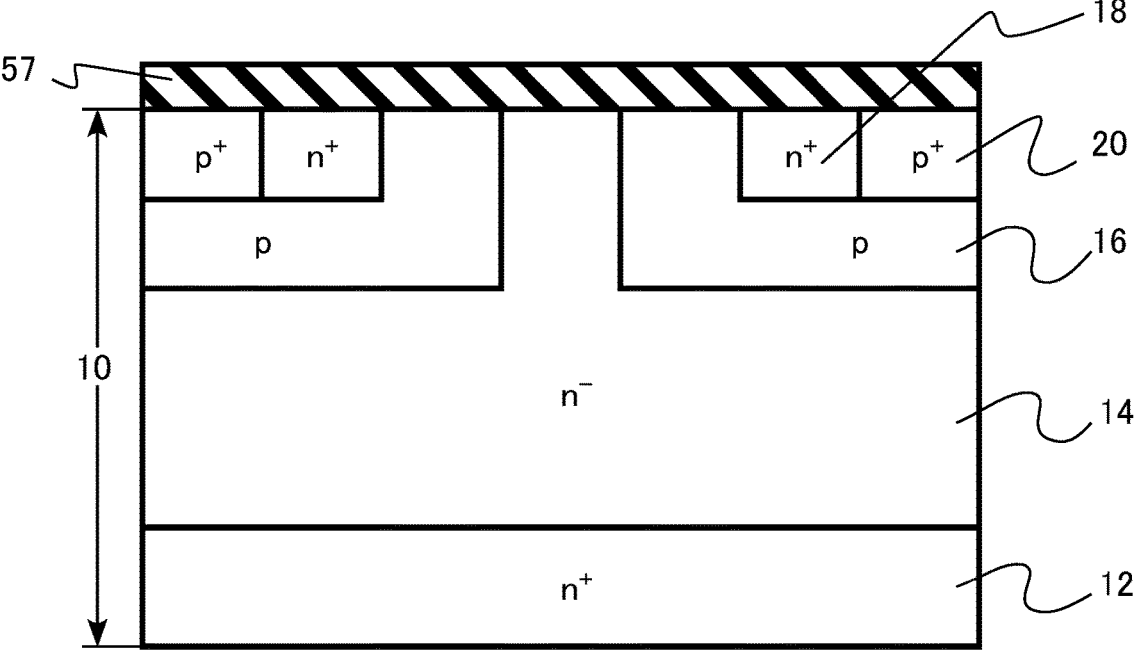
FIG. 18 is an explanatory diagram of the method for manufacturing a semiconductor device of the first embodiment.

In step S111, a silicon oxide film 57 is formed on the silicon carbide layer 10 (FIG. 18). The silicon oxide film 57 finally becomes the gate insulating layer 28.

The silicon oxide film 57 is formed by, for example, a vapor phase growth method at a low temperature and a low oxygen partial pressure. The silicon oxide film 57 is formed by, for example, a CVD method at a low temperature and a low oxygen partial pressure, or a PVD method. The silicon oxide film 57 is a deposited film. A thickness of the silicon oxide film 57 is, for example, equal to or more than 30 nm and equal to or less than 100 nm.

The silicon oxide film 57 is, for example, a silicon oxide film formed by a CVD method by using tetraethyl orthosilicate (TEOS) as a source gas. The silicon oxide film 57 is, for example, a silicon oxide film formed by a CVD method by using a dichlorosilane gas ($SiH_2Cl_2$) and a nitrous oxide gas ($N_2O$) as source gases.

In step S112, the second heat treatment is performed. The second heat treatment is performed in an atmosphere containing ammonia gas ($NH_3$).

For example, the heat treatment is performed by supplying ammonia gas ($NH_3$) to a reaction furnace containing the silicon carbide layer 10.

A temperature of the second heat treatment is, for example, equal to or more than 1200° C. and equal to or less than 1600° C.

A partial pressure of the ammonia gas in the atmosphere of the second heat treatment is, for example, equal to or more than 90%.

Figure 19:
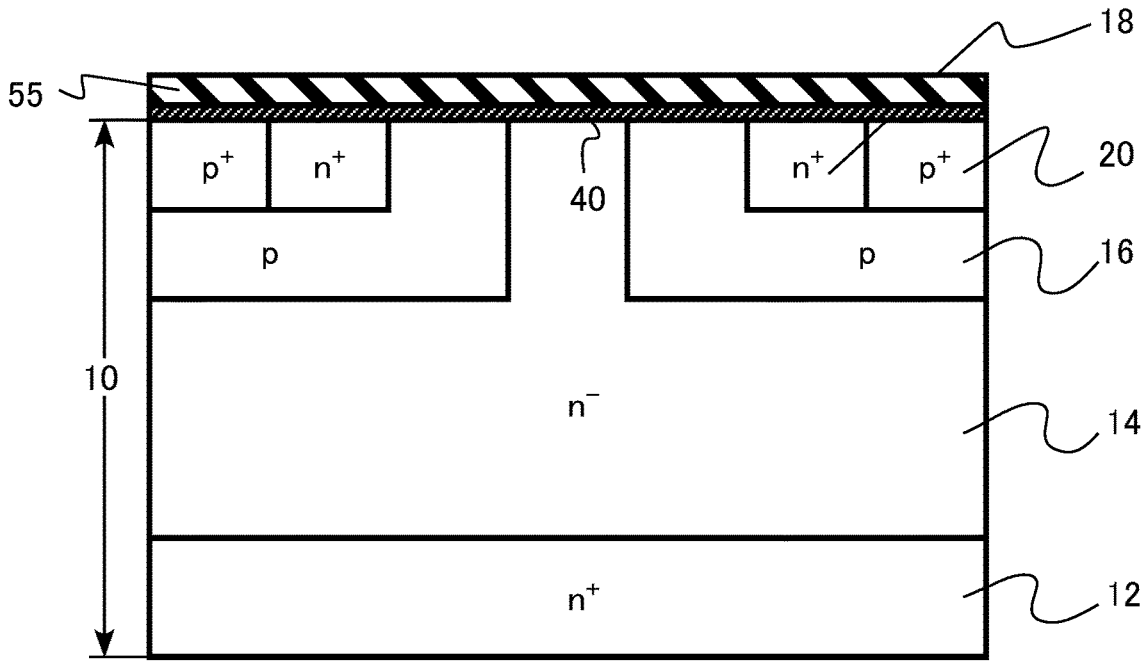
FIG. 19 is an explanatory diagram of the method for manufacturing a semiconductor device of the first embodiment.

The interface termination region 40 is formed at an interface between the silicon carbide layer 10 and the silicon oxide film by the second heat treatment (FIG. 19).

The second heat treatment also functions as densify annealing of the silicon oxide film. By the second heat treatment, the silicon oxide film becomes a high-density film.

In step S113, the third heat treatment is performed. The third heat treatment is performed in an atmosphere containing nitrogen oxide gas (NOx). The nitrogen oxide gas is, for example, nitric oxide gas (NO). The nitrogen oxide gas is, for example, nitrous oxide gas ($N_2O$).

For example, the heat treatment is performed by supplying nitrogen oxide gas (NOx) to a reaction furnace containing the silicon carbide layer 10.

A temperature of the third heat treatment is, for example, equal to or more than 750° C. and equal to or less than 1050° C. The temperature of the third heat treatment is lower than the temperature of the second heat treatment, for example.

A partial pressure of the nitrogen oxide gas in the atmosphere of the third heat treatment is, for example, equal to or more than 10%.

Nitrogen in the silicon oxide film is removed by the third heat treatment. A silicon oxide film with a reduced nitrogen defect is formed by the third heat treatment.

In step S114, the gate electrode 30 is formed on the gate insulating layer 28. The gate electrode 30 is, for example, polycrystalline silicon containing a p-type impurity or an n-type impurity.

Figure 20:
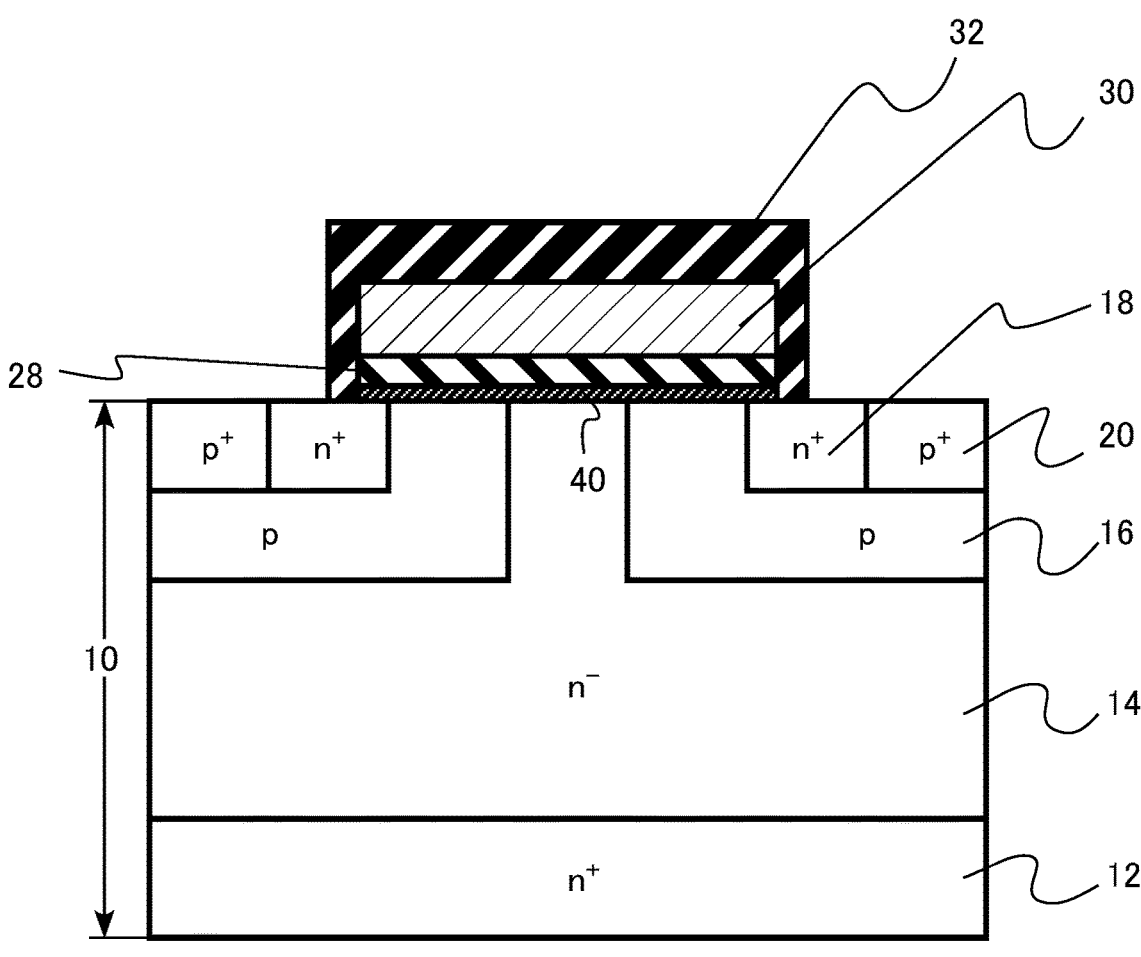
FIG. 20 is an explanatory diagram of the method for manufacturing a semiconductor device of the first embodiment.

In step S115, the interlayer insulating film 32 is formed on the gate electrode 30 (FIG. 20). The interlayer insulating film 32 is, for example, a silicon oxide film.

In step S116, the source electrode 34 and the drain electrode 36 are formed. The source electrode 34 is formed on the source region 18 and the p-well contact region 20.

The source electrode 34 is formed by sputtering of nickel (Ni) and aluminum (Al), for example.

The drain electrode 36 is formed on the back surface side of the silicon carbide layer 10. The drain electrode 36 is formed by, for example, sputtering of nickel.

The MOSFET 100 illustrated in FIG. 1 is formed by the above manufacturing method.

Next, functions and effects of the semiconductor device and the method for manufacturing a semiconductor device of the first embodiment will be described.

The amount of carbon vacancies in the silicon carbide layer 10 is reduced, and thus, the MOSFET 100 of the first embodiment can suppress the decrease in the carrier mobility. In the method for manufacturing the MOSFET 100 of the first embodiment, the amount of carbon vacancies in the silicon carbide layer 10 is reduced by ion-implanting carbon in addition to the ion implantation of aluminum and performing the hydrogen etching process on the front surface of the silicon carbide layer 10 after oxidation treatment. Details will be described below.

When the MOSFET is formed by using the silicon carbide, there is a problem that the carrier mobility decreases. One factor that decreases the carrier mobility is considered to be an interface state between the silicon carbide layer and the gate insulating layer. The interface state is considered to be generated by a dangling bond present on the front surface of the silicon carbide layer.

The MOSFET 100 of the first embodiment includes the interface termination region 40 in which nitrogen is segregated between the silicon carbide layer 10 and the gate insulating layer 28. In the interface termination region 40, the dangling bond is reduced by bonding the nitrogen atom to the silicon atom in three-coordination. Accordingly, the MOSFET in which the decrease in the carrier mobility is suppressed is realized.

90% or more of the nitrogen atoms present in the interface termination region 40 are preferably three-coordinated nitrogen atoms, and 99% or more of the nitrogen atoms are more preferably three-coordinated nitrogen atoms. A concentration of the three-coordinated nitrogen atoms is, for example, equal to or more than $1 \times 10^{21}$ $cm^{-3}$. A concentration of the four-coordinated nitrogen atoms is, for example, equal to or less than $1 \times 10^{19}$ $cm^{-3}$. The concentration of the four-coordinated nitrogen atoms are preferably equal to or less than $1 \times 10^{18}$ $cm^{-3}$, and more preferably equal to or less than $1 \times 10^{17}$ $cm^{-3}$.

From the viewpoint of suppressing the decrease in the carrier mobility of the MOSFET 100, a peak nitrogen concentration of the interface termination region 40 of the nitrogen concentration distribution is preferably equal to or more than $1 \times 10^{22}$ $cm^{-3}$, and more preferably equal to or more than $5 \times 10^{22}$ $cm^{-3}$.

When there is extra nitrogen, the peak nitrogen concentration of the interface termination region 40 of the nitrogen concentration distribution is preferably equal to or less than $1 \times 10^{23}$ $cm^{-3}$ due to charge trapping.

The peak nitrogen concentration of the interface termination region 40 in the nitrogen concentration distribution is preferably $5.0 \times 10^{22}$ $cm^{-3} \pm 5\%$. When the peak nitrogen concentration is in a range of $5.0 \times 10^{22}$ $cm^{-3} \pm 5°$, the MOSFET 100 exhibits good characteristics with less charge trapping.

An area density of the nitrogen in the interface termination region 40 is preferably equal to or more than $1 \times 10^{14}$ $cm^{-2}$ and equal to or less than $2.5 \times 10^{15}$ $cm^{-2}$. An area density of the nitrogen in the interface termination region 40 is preferably $1.4 \times 10^{15}$ $cm^{-2} \pm 5\%$. When the area density of the nitrogen is in the above range, the MOSFET 100 exhibits good characteristics with less charge trapping.

When the MOSFET is formed by using the silicon carbide, there are problems that the carrier mobility decreases or a threshold voltage fluctuates. There is a problem that a leakage current of the gate insulating layer increases or reliability of the gate insulating layer decreases. One factor that causes the above problem is considered to be the carbon defect or the nitrogen defect present in the gate insulating layer.

The carbon defect and the nitrogen defect are considered to cause the above problem by forming a trap level in the gate insulating layer.

In the MOSFET 100 of the first embodiment, the nitrogen concentration at the second position X2 1 nm away from the peak of the interface termination region 40 of the nitrogen concentration distribution toward the gate insulating layer 28 is equal to or less than $1 \times 10^{18}$ $cm^{-3}$, and the carbon concentration at the second position X2 is equal to or less than $1 \times 10^{18}$ $cm^{-3}$. In the MOSFET 100, the carbon and nitrogen concentrations in the gate insulating layer 28 are low. Accordingly, the amount of carbon defects and the amount of nitrogen defects in the gate insulating layer 28 are sufficiently reduced. Thus, the decrease in the carrier mobility, the fluctuation in the threshold voltage, the increase in the leakage current of the gate insulating layer, or the decrease in the reliability of the gate insulating layer due to the carbon defects or nitrogen defects are suppressed.

The nitrogen concentration at the second position X2 1 nm away from the peak of the interface termination region 40 in the nitrogen concentration distribution toward the gate insulating layer 28 is preferably equal to or less than $1 \times 10^{17}$ $cm^{-3}$, and more preferably e $1 \times 10^{16}$ $cm^{-3}$.

Another factor of the problem that the carrier mobility decreases when the MOSFET is formed by using the silicon carbide is considered to be the presence of the carbon vacancies in the silicon carbide layer 10.

For example, it is considered that the presence of the carbon vacancies in a channel formation region of the MOSFET causes scattering of the carriers and reduces the carrier mobility.

In the MOSFET 100 of the first embodiment, in the channel portion 16a between the gate insulating layer 28 and the first position X1 100 nm away from the gate insulating layer 28 toward the silicon carbide layer 10, the $Z_{1/2}$ level density measured by DLTS is equal to or less than $1 \times 10^{11}$ $cm^{-3}$.

The $Z_{1/2}$ level density measured by DLTS corresponds to a density of the carbon vacancies. The $Z_{1/2}$ level density is equal to or less than $1 \times 10^{11}$ $cm^{-3}$, and thus, the density of the carbon vacancies under the gate insulating layer 28 is equal to or less than $1 \times 10^{11}$ $cm^{-3}$. The density of the carbon vacancies under the channel portion 16a of the gate insulating layer 28 is sufficiently reduced. Accordingly, the decrease in the carrier mobility due to the carbon vacancies in the silicon carbide layer 10 is suppressed.

The $Z_{1/2}$ level density measured by DLTS is preferably equal to or less than $5 \times 10^{10}$ $cm^{-3}$, and more preferably equal to or less than $1 \times 10^{10}$ $cm^{-3}$. That is, the density of the carbon vacancies under the gate insulating layer 28 is preferably equal to or less than $5 \times 10^{10}$ $cm^{-3}$, and more preferably equal to or less than $1 \times 10^{10}$ $cm^{-3}$. The decrease in the carrier mobility due to the carbon vacancies in the silicon carbide layer 10 is further suppressed.

The intensity of the infrared absorption at a wave number of 838 $cm^{-1}$ measured by the attenuated total reflection method (ATR method) in the Fourier transform infrared spectroscopy method (FTIR method) corresponds to the density of the carbon vacancies. The infrared absorption at a wave number of 838 cm$^{-1}$ corresponds to a residual product generated in the silicon carbide layer when the silicon carbide layer is oxidized. The residual product has Si—O bonds. The infrared absorption at wave number 838 cm$^{-1}$ is based on the presence of the Si—O bonds.

When the silicon carbide layer is oxidized, a lattice of the silicon carbide is strained and carbon vacancies are formed. Accordingly, a portion of the silicon carbide layer where the density of the residual product is high has a high density of carbon vacancies.

In the MOSFET 100 of the first embodiment, in the channel portion 16$a$ between the gate insulating layer 28 and the first position X1 100 nm away from the gate insulating layer 28 toward the silicon carbide layer 10, the ratio of the intensity of infrared absorption at a wave number of 838 cm$^{-1}$, which is measured by the attenuated total reflection method (ATR method) in the Fourier transform infrared spectroscopy method (FTIR method), to the intensity of the infrared absorption at a wave number of 970 cm$^{-1}$ is equal to or less than 1.0. The infrared absorption at a wave number of 970 cm$^{-1}$ corresponds to a longitudinal optical phonon mode of the silicon carbide. The intensity of the infrared absorption at a wave number of 970 cm$^{-1}$ is used to normalize the intensity of the infrared absorption at a wave number of 838 cm$^{-1}$.

In the MOSFET 100, in the channel portion 16$a$ of the p-well region 16, the ratio of the intensity of the infrared absorption at a wave number of 838 cm$^{-1}$, which is measured by the attenuated total reflection method (ATR method) in the Fourier transform infrared spectroscopy method (FTIR method), to the intensity of the infrared absorption at a wave number of 970 cm$^{-1}$ is equal to or less than 1.0, and the density of the carbon vacancies in the p-well region 16 immediately below the gate insulating layer 28 is low. Accordingly, the decrease in the carrier mobility due to the carbon vacancies in the silicon carbide layer 10 is suppressed.

From the viewpoint of suppressing the decrease in the carrier mobility, in the channel portion 16$a$ of the p-well region 16, the ratio of the intensity of the infrared absorption at a wave number of 838 cm$^{-1}$ which is measured by the attenuated total reflection method (ATR method) in the Fourier transform infrared spectroscopy method (FTIR method), to the intensity of the infrared absorption at a wave number of 970 cm$^{-1}$ is preferably equal to or less than 0.5, and more preferably equal to or less than 0.1.

In the MOSFET 100, the amount of nitrogen atoms bonded to four silicon atoms at the fourth position X4 5 nm away from the gate insulating layer 28 toward the silicon carbide layer 10 is equal to or more than 80% and equal to or less than 120% of the amount of nitrogen atoms bonded to four silicon atoms at the fifth position X5 5 μm away from the gate insulating layer 28 toward the silicon carbide layer 10. In other words, the amount of nitrogen atoms four-coordinated at the fourth position X4 is equal to or more than 80% and equal to or less than 120% of the amount of nitrogen atoms four-coordinated at the fifth position X5. The four-coordinated nitrogen atoms function as donors.

The nitrogen concentration at the fourth position X4 is preferably equal to or less than 1×10$^{18}$ cm$^{-3}$, more preferably equal to or less than 1×10$^{17}$ cm$^{-3}$, and still more preferably equal to or less than 2×10$^{16}$ cm$^{-3}$. The nitrogen concentration at the fifth position X5 is preferably equal to or less than 1×10$^{18}$ cm$^{-3}$, more preferably equal to or less than 1×10$^{17}$ cm$^{-3}$, and still more preferably equal to or less than 2×10$^{16}$ cm$^{-3}$.

In the MOSFET 100, the density of the carbon vacancies in the channel portion 16$a$ is low, and thus, the density of the carbon vacancies in the channel portion 16$a$ is substantially equal to the density of the carbon vacancies in the drift region 14. Accordingly, the amount of nitrogen atoms to be four-coordinated by filling the carbon vacancies in the channel portion 16$a$ is substantially equal to the amount of nitrogen atoms to be four-coordinated by filling the carbon vacancies in the drift region 14. Thus, the amount of nitrogen atoms four-coordinated in the channel portion 16$a$ is equal to or more than 80% and equal to or less than 120% of the amount of nitrogen atoms four-coordinated in the drift region 14.

In the MOSFET 100 of the first embodiment, the density of the carbon vacancies in the channel portion 16$a$ is sufficiently low. Thus, the hole mobility of the electrons in the channel portion 16$a$ is equal to or more than 200 cm$^2$/V·s. The hole mobility of the electrons in the channel portion 16$a$ is preferably equal to or more than 350 cm$^2$/V·s, and more preferably equal to or more than 450 cm$^2$/V·s.

Field effect mobility serving as an index of an on-current of the MOSFET is determined in accordance with a ratio of movable charges in the hole mobility. That is, the field effect mobility is smaller than the hole mobility. At a MOS interface of the silicon carbide, a proportion of movable charges is low due to poor interface termination efficiency and a large amount of substrate defects and defects in the gate insulating layer. Charges other than the movable charges are trapped charges.

For example, it is possible to increase the proportion of the movable charges by an interface termination method and optimization of the termination element. However, when the hole mobility is low, it is difficult to significantly improve the field effect mobility. In order to significantly improve the field effect mobility, it is desired to improve the hole mobility to 150 cm$^2$/V·s or more.

In the first embodiment, the hole mobility can be significantly improved by reducing the density of carbon vacancies. The hole mobility is, for example, equal to or more than 200 cm$^2$/V·s. The density of the carbon vacancies are further reduced, and thus, hole mobility of 350 cm$^2$/V·s or more, further 450 cm$^2$/V·s or more is achieved.

In the MOSFET 100 of the first embodiment, the nitrogen concentration at the third position X3 1 nm away from the peak of the interface termination region 40 of the nitrogen concentration distribution toward the silicon carbide layer is equal to or less than 1×10$^{18}$ cm$^{-3}$. Since the nitrogen concentration of the silicon carbide layer 10 in the vicinity of the gate insulating layer 28 is low, a high threshold voltage of the MOSFET 100 can be realized.

The nitrogen concentration at the third position X3 1 nm away from the peak of the interface termination region 40 of the nitrogen concentration distribution toward the silicon carbide layer is equal to or less than 1×10$^{18}$ cm$^{-3}$. The nitrogen concentration at the third position X3 is preferably equal to or less than 1×10$^{17}$ cm$^{-3}$, and more preferably equal to or less than 2×10$^{16}$ cm$^{-3}$.

The following three processes are conceivable as a manufacturing process in which the carbon vacancies for reducing the carrier mobility are generated in the silicon carbide layer when the MOSFET is manufactured.

A first process is ion implantation of impurities into the silicon carbide layer. Carbon vacancies and interstitial carbon are formed in the silicon carbide layer 10 by energy of ion-implanted impurities. For example, in the p-well region, carbon vacancies and interstitial carbon having a volume density similar to a volume density of implanted ions are formed.

A second process is activation annealing for activating impurities introduced into the silicon carbide layer by ion implantation. During the activation annealing, in order to reduce free energy of a system of the silicon carbide layer, carbon vacancies and interstitial carbon are generated in the silicon carbide layer, and entropy increases. The amount of carbon vacancies and the amount of interstitial carbon generated increases as a temperature of the activation annealing increases. Since the formation of the silicon carbide layer by epitaxial growth is also a high-temperature treatment, carbon vacancies on the order of $10^{13}$ cm$^{-3}$ remain in the silicon carbide layer. When activation annealing at a high temperature is performed, carbon vacancies on the order of $1\times10^{14}$ cm$^{-3}$ are formed.

A third process is a process of oxidizing the front surface of the silicon carbide layer. For example, the treatment is an asking treatment, a deposition treatment of depositing an oxide film, or a thermal oxidation treatment of forming a thermal oxide film. For example, the third process is a process of using a nitrogen oxide gas for forming the interface termination region. Carbon vacancies and interstitial carbon are formed in the silicon carbide layer by distortion generated on the front surface of the silicon carbide layer during oxidation. The front surface is greatly distorted by oxidation to form carbon vacancies of the order of $1\times10^{18}$ cm$^{-3}$.

In the method for manufacturing the MOSFET 100 of the first embodiment, after aluminum ion implantation for forming the p-well region 16 in the silicon carbide layer 10 is performed, the ion implantation of carbon is performed in the same region of the silicon carbide layer 10. The second dose amount of carbon is equal to or more than 10 times the first dose amount of aluminum.

According to the method for manufacturing the MOSFET 100 of the first embodiment, a large amount of surplus interstitial carbon is present in the p-well region 16 by the ion implantation of carbon. By the heat treatment performed after the ion implantation of carbon, the carbon vacancies generated by the ion implantation of aluminum are filled with the surplus interstitial carbon. Accordingly, the amount of carbon vacancies in the p-well region 16 is reduced.

From the viewpoint of appropriately maintaining the p-type impurity concentration of the p-well region 16, the first dose amount of aluminum is equal to or less than preferably $1\times10^{14}$ cm$^{-2}$. From the viewpoint of reducing the amount of carbon vacancies in the p-well region 16, the second dose amount of carbon is preferably equal to or more than $1\times10^{16}$ cm$^{-2}$, and more preferably equal to or more than $1\times10^{16}$ cm$^{-2}$.

From the viewpoint of reducing the amount of carbon vacancies in the p-well region 16, the second dose amount of carbon is preferably equal to or more than 100 times the first dose amount of aluminum.

From the viewpoint of reducing the amount of carbon vacancies in the p-well region 16, the second projected range Rp2 of the ion implantation of carbon is preferably equal to or more than 80% and equal to or less than 120%, and more preferably equal to or more than 90% and equal to or less than 110% of the first projected range Rp1 of the ion implantation of aluminum.

The first projected range Rp1 and the second projected range Rp2 are brought into contact with each other, and thus, it becomes easy for the carbon concentration distribution after the ion implantation to completely cover the aluminum concentration distribution after the ion implantation. The carbon concentration distribution after the ion implantation completely covers the aluminum concentration distribution after ion implantation, and thus, the amount of carbon vacancies in the p-well region 16 is reduced.

From the viewpoint of appropriately maintaining the depth of the p-well region 16, the first projected range Rp1 and the second projected range Rp2 are preferably equal to or less than 0.6 μm.

In the method for manufacturing the MOSFET 100 of the first embodiment, a large amount of surplus interstitial carbon is present in the silicon carbide layer 10 during the first heat treatment for activating aluminum introduced into the silicon carbide layer 10 by ion implantation. A large amount of interstitial carbon is present, and thus, the increase in entropy necessary for reducing the free energy of the system of the silicon carbide layer 10 is obtained. Accordingly, an increase in the amount of carbon vacancies in the silicon carbide layer 10 due to the first heat treatment is suppressed.

In the method for manufacturing the MOSFET 100 of the first embodiment, since a large amount of surplus interstitial carbon is present in the silicon carbide layer 10 during the first heat treatment, aluminum atoms are prevented from entering the carbon site of the silicon carbide. Accordingly, the aluminum atoms are promoted to enter the silicon site of the silicon carbide. Thus, the activation rate of aluminum is improved.

In the method for manufacturing the MOSFET 100 of the first embodiment, since a large amount of surplus interstitial carbon is present in the silicon carbide layer 10 during the first heat treatment, the increase in the amount of carbon vacancies in the silicon carbide layer 10 is suppressed even though the first heat treatment is performed at a high temperature. Accordingly, it is possible to increase the temperature of the first heat treatment. Thus, the activation rate of aluminum can be improved.

From the viewpoint of improving the activation rate of aluminum, the temperature of the first heat treatment is preferably equal to or more than 1850° C., more preferably equal to or more than 1900° C., and still more preferably equal to or more than 1950° C. From the viewpoint of performing an efficient process, the temperature of the first heat treatment is preferably equal to or less than 2000° C. From the viewpoint of the activation rate, a large increase in the activation rate cannot be expected even though the temperature exceeds 2000° C.

The first heat treatment preferably includes a first step of 1600° C. or more and a second step of a temperature lower than in the first step. The second step is preferably equal to or less than 1000° C. A heat treatment time in the second step is longer than a heat treatment time in the first step.

In the first step, aluminum and phosphorus ion-implanted into the silicon carbide layer 10 are activated, and interstitial carbon fills the carbon vacancies. Even though the carbon vacancies are filled, there is a surplus of interstitial carbon. In the second step of the low temperature, excessive interstitial carbon is expelled from the silicon carbide layer 10 and is absorbed by the carbon film 54.

The increase in the carbon vacancies is suppressed by performing the second step of the low temperature. In the second step, the interstitial carbon in the silicon carbide layer 10 can be reduced. Accordingly, it is possible to suppress the increase in the carbon defect in the gate insulating layer 28 in the heat treatment after the first heat treatment.

Figure 21:
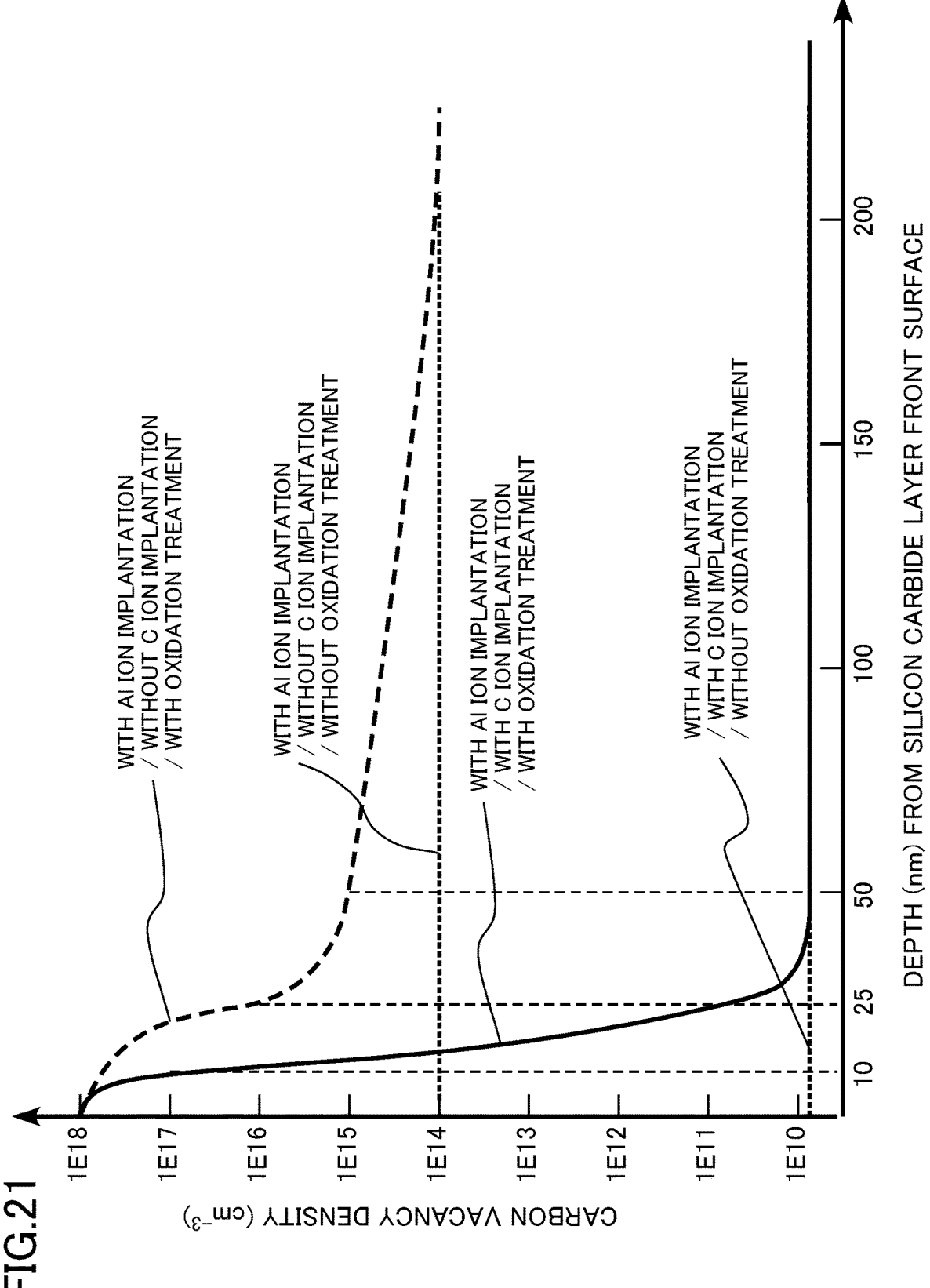
FIG. 21 is an explanatory diagram of functions and effects of the method for manufacturing a semiconductor device of the first embodiment.

FIG. 21 is an explanatory diagram of the functions and effects of the method for manufacturing a semiconductor device of the first embodiment. FIG. 21 is a diagram illustrating a relationship between a depth from the silicon carbide layer front surface and the carbon vacancy density.

As illustrated in FIG. 21, when the ion implantation of carbon is performed in addition to the ion implantation of aluminum, the carbon vacancy density can be kept low at 1E11 cm$^{-3}$ or less unless an oxidation treatment is performed on the silicon carbide layer. However, when the oxidation treatment is performed after the ion implantation, for example, the carbon vacancy density increases up to a region of 25 nm from the silicon carbide layer front surface. This is considered to be because the carbon vacancies are generated by distortion occurring on the silicon carbide layer front surface due to the oxidation treatment.

In order to achieve a carbon vacancy density of 1E11 cm$^{-3}$ or less, the first heat treatment preferably includes the first step of 1600° C. or more and the second step of the temperature lower than in the first step. The second step is preferably equal to or less than 1000° C. For example, the heat treatment time in the second step is longer than the heat treatment time in the first step. In the first step, interstitial carbon fills the carbon vacancies. Even though the carbon vacancies are filled, there is a surplus of interstitial carbon. In the second step of the low temperature, excessive interstitial carbon is expelled from the silicon carbide layer and is absorbed by the carbon film covering the front surface during annealing.

It is possible to set the carbon vacancy density of the silicon carbide layer to be equal to or less than 1E10 cm$^{-3}$ by increasing the temperature and the time of the first heat treatment. Even in the case of the oxidation treatment, similarly, the carbon vacancy density can be set to be equal to or less than 1E11 cm$^{-3}$ from a position of 25 nm from the silicon carbide layer front surface to the back, and the carbon vacancy density can be set to be equal to or less than 1E10 cm$^{-3}$ from a position of 50 nm to the back.

As illustrated in FIG. 21, when the ion implantation of carbon is not performed in addition to the ion implantation of aluminum and when the oxidation treatment is performed after the ion implantation, for example, the carbon vacancy density increases up to a region of 200 nm from the silicon carbide layer front surface. When the ion implantation of carbon is not performed, since ion implantation damage of aluminum remains and the carbon vacancy density of the silicon carbide layer before the oxidation treatment is as high as about 1E14 cm$^{-3}$, the diffusion of oxygen through the carbon vacancies is promoted, and the distortion of the silicon carbide occurs up to a deep region of the silicon carbide layer. For example, even though the p-well region is formed by epitaxial growth instead of the ion implantation, it is considered that the carbon vacancy density of the silicon carbide layer is equal to or more than 1E13 cm$^{-3}$, the diffusion of the oxygen through the carbon vacancies is promoted, the distortion of the silicon carbide occurs up to a deep region of the silicon carbide layer, and the carbon vacancy density increases.

In the method for manufacturing the MOSFET 100 of the first embodiment, after the oxidation treatment is performed on the silicon carbide layer 10, the front surface of the silicon carbide layer 10 is etched by the hydrogen etching process. The oxidation treatment is, for example, the ashing treatment using the oxygen plasma for removing the carbon film 54, the deposition treatment of depositing the field oxide film 55, and the thermal oxidation treatment of forming the sacrificial oxide film 56.

A region having a high carbon vacancy density is removed by the hydrogen etching process, and thus, the carbon vacancy density on the front surface of the silicon carbide layer 10 is reduced. Accordingly, the amount of carbon vacancies in the p-well region 16 immediately below the gate insulating layer 28 is reduced.

From the viewpoint of reducing the carbon vacancy density of the front surface of the silicon carbide layer 10, an etching amount of the front surface of the silicon carbide layer 10 by the hydrogen etching process is equal to or more than at least 10 nm. The etching amount is preferably equal to or more than 15 nm, more preferably equal to or more than 25 nm, and still more preferably equal to or more than 50 nm. Since the carbon vacancy density does not change even though hydrogen etching of 100 nm or more is performed, etching of 100 nm or more may not be required.

When the carbon vacancy density is 1E17 cm$^{-3}$, the hole mobility is expected to be about 130 cm$^2$/V·s, when the carbon vacancy density is 1E16 cm$^{-3}$, the hole mobility is expected to be about 160 cm$^2$/V·s, when the carbon vacancy density is 1E15 cm$^{-3}$, the hole mobility is expected to be about 180 cm$^2$/V·s, when the carbon vacancy density is 1E14 cm$^{-3}$, the hole mobility is expected to be about 200 cm$^2$/V·s, when the carbon vacancy density is 1E13 cm$^{-3}$, the hole mobility is expected to be about 250 cm$^2$/V·s, when the carbon vacancy density is 1E12 cm$^{-3}$, the hole mobility is expected to be about 300 cm$^2$/V·s, and when the carbon vacancy density is 1E11 cm$^{-3}$, the hole mobility is expected to be about 350 cm$^2$/V·s, when the carbon vacancy density is 5E10 cm$^{-3}$, the hole mobility is expected to be about 400 cm$^{-3}$/V·s, and when the carbon vacancy density is 1E10 cm$^{-3}$, the hole mobility is expected to be about 450 cm$^2$/V·s.

When the etching amount of the front surface of the silicon carbide layer 10 by the hydrogen etching process is equal to or more than 15 nm, the hole mobility is about 200 cm$^2$/V·s. A numerical value of the hole mobility of 200 cm$^2$/V·s is considered to be a value that is difficult to achieve unless ion implantation of a large amount of carbon is performed in addition to the ion implantation of aluminum and the hydrogen etching process is performed after the oxidation treatment is performed. When the etching amount is equal to or more than 25 nm, the hole mobility is about 350 cm$^2$/V·s. When the etching amount is equal to or more than 50 nm, the hole mobility reaches 450 cm$^2$/V·s.

In the method for manufacturing the MOSFET 100 of the first embodiment, the gate insulating layer 28 is formed by vapor phase growth at a low temperature and a low oxygen partial pressure. Accordingly, the oxidation of the front surface of the silicon carbide layer 10 is suppressed as compared with the thermal oxidation. Thus, the increase in the amount of carbon vacancies in the silicon carbide layer 10 during the formation of the gate insulating layer 28 is suppressed.

In the method for manufacturing the MOSFET 100 of the first embodiment, the interface termination region 40 is formed by the second heat treatment of the atmosphere containing the ammonia gas (NH$_3$). The interface termination region 40 is formed in an atmosphere containing ammonia gas without accompanying interface oxidation, and thus, the increase in the amount of carbon vacancies in the silicon carbide layer 10 is suppressed.

Since the second heat treatment is not accompanied by oxidation, there is no emission of extra carbon from the silicon carbide layer 10. Thus, extra carbon is prevented from diffusing into the gate insulating layer to form the carbon defect in the gate insulating layer.

It is preferable to adjust a condition for the second heat treatment such that the interface termination region 40 containing sufficient nitrogen can be formed. The second heat treatment is performed, for example, in a low oxygen state where the oxygen partial pressure is equal to or less than 1 ppm. The second heat treatment is, for example, a high temperature treatment of 1200° C. or more and 1600° C. or less. From the viewpoint of increasing the nitrogen concentration in the interface termination region 40, the second heat treatment is preferably equal to or more than 1300° C., and more preferably equal to or more than 1400° C.

Even though nitrogen is introduced into the gate insulating layer, a complex defect (C—O—N defect) of nitrogen and carbon is not formed unless carbon is present together in the gate insulating layer. Accordingly, the second heat treatment can be performed for a long time. Thus, the treatment can be performed for a long time until the nitrogen in the interface termination region 40 reaches a sufficient amount, for example, $1 \times 10^{22}$ cm$^{-3}$ or more. The second heat treatment is, for example, 1300° C. for 1 hour, and is, for example, 1400° C. for 30 minutes.

For example, it is also possible to form the interface termination region 40 with interface oxidation by a high temperature treatment with nitric oxide gas (NO) or the like. In this case, during the interface oxidation, carbon vacancies are formed in the silicon carbide layer due to the distortion occurring on the front surface of the silicon carbide layer. Thus, even though the amount of carbon vacancies is reduced before the interface termination region 40 is formed, the amount of carbon vacancies increases again. That is, when the interface termination region 40 is formed with the interface oxidation, even though the carbon vacancies are reduced before the interface termination region 40 is formed, the carbon vacancies are not finally reduced.

When the interface termination region 40 is formed with the interface oxidation by a high temperature treatment with nitric oxide gas (NO) or the like, excessive carbon due to the oxidation of the substrate is emitted from the silicon carbide layer 10. There is also a problem that the emitted carbon diffuses into the gate insulating layer and a large amount of carbon defects are generated in the gate insulating layer.

Even though the second heat treatment is performed in the second atmosphere containing nitrogen gas and hydrogen gas or a third atmosphere containing nitrogen gas and carbon dioxide gas, the increase in the amount of carbon vacancies in the silicon carbide layer 10 can be suppressed.

In the method for manufacturing the MOSFET 100 of the first embodiment, after the second heat treatment of forming the interface termination region 40, the third heat treatment is performed in an atmosphere containing nitrogen oxide gas (NOx).

Nitrogen in the gate insulating layer 28 is removed by the third heat treatment. By the third heat treatment, the gate insulating layer 28 with a reduced nitrogen defect is formed.

From the viewpoint of suppressing the oxidation of the front surface of the silicon carbide layer 10 by the third heat treatment, the temperature of the third heat treatment is preferably lower than the temperature of the second heat treatment.

From the viewpoint of reducing the nitrogen defect in the gate insulating layer 28, the temperature of the third heat treatment is preferably equal to or more than 800° C., more preferably equal to or more than 850° C., and still more preferably equal to or more than 925° C.

From the viewpoint of reducing the nitrogen defect in the gate insulating layer 28, the nitrogen oxide gas of the third heat treatment is preferably nitrous oxide gas ($N_2O$) having high oxidizability.

From the viewpoint of suppressing the oxidation of the silicon carbide layer 10, the temperature of the third heat treatment is preferably equal to or less than 1000° C., and more preferably equal to or less than 950° C.

In the method for manufacturing the MOSFET 100 of the first embodiment, the interface termination region 40 containing sufficient nitrogen is formed by the second heat treatment. The second heat treatment is preferably in a low oxygen state with an oxygen partial pressure of 1 ppm or less, at a high temperature, and for a long time. An oxidation resistance of the silicon carbide layer 10 is improved by the second heat treatment.

Thus, even though the third heat treatment is performed at a high temperature of, for example, 1050° C., the oxidation of the front surface of the silicon carbide layer 10 is suppressed when the third heat treatment is performed for 5 minutes or less, for example. In order to reliably remove the nitrogen from the gate insulating layer 28, it is preferable to perform a long-time treatment at a low temperature where there is less concern about the oxidation of the front surface of the silicon carbide layer 10. For example, the third heat treatment is preferably a heat treatment of nitrous oxide gas ($N_2O$) at 950° C. for 3 hours.

After the third heat treatment, for example, it can be confirmed that the oxidation of the front surface of the silicon carbide layer 10 has not occurred by measuring that a capacitance change of a MOS capacitor of the gate does not occur. Alternatively, when the TEM image is directly viewed, it can be confirmed that the oxide layer has not grown on the front surface of the silicon carbide layer 10.

The point that the oxidation resistance of the silicon carbide layer 10 is improved by the second heat treatment can be said to be a premise of the third heat treatment. When the second treatment is not appropriately performed, the front surface of the silicon carbide layer 10 is oxidized by the third treatment. The carbon vacancies are formed in the silicon carbide layer 10 by oxidation, which is not preferable.

In the method for manufacturing the MOSFET 100 of the first embodiment, the oxidation of the front surface of the silicon carbide layer after the formation of the gate insulating layer 28 is suppressed, and thus, the amount of carbon in the gate insulating layer 28 is reduced. Accordingly, the amount of carbon defects in the gate insulating layer 28 is also reduced.

In the method for manufacturing the MOSFET 100 of the first embodiment, the increase in the amount of carbon vacancies in the silicon carbide layer 10 is suppressed, and thus, for example, the nitrogen atoms are prevented from entering the carbon vacancies and becoming donors when the interface termination region 40 is formed. Accordingly, the decrease in the threshold voltage of the MOSFET 100 is suppressed.

As described above, according to the first embodiment, the semiconductor device and the method for manufacturing a semiconductor device capable of suppressing the decrease in the carrier mobility are realized by reducing the amount of carbon vacancies in the silicon carbide layer.

Second Embodiment

A method for manufacturing a semiconductor device of a second embodiment is different from the method for manufacturing a semiconductor device of the first embodiment in that the second heat treatment in the atmosphere containing nitrogen is performed before the formation of the silicon oxide film. Hereinafter, a part of contents overlapping with the contents of the first embodiment will not be described.

Hereinafter, an example in which the second heat treatment is performed in the first atmosphere containing ammonia gas will be described.

FIG. 22 is a process flow diagram of the method for manufacturing a semiconductor device of the second embodiment. The MOSFET 100 illustrated in FIG. 1 is formed by the method for manufacturing a semiconductor device of the second embodiment.

As illustrated in FIG. 22, the method for manufacturing a semiconductor device of the second embodiment includes silicon carbide layer preparation (step S200), aluminum ion implantation (step S201), carbon ion implantation (step S202), phosphorus ion implantation (step S203), aluminum ion implantation (step S204), carbon film formation (step S205), first heat treatment (step S206), carbon film removal (step S207), field oxide film formation (step S208), sacrificial oxide film formation (step S209), a hydrogen etching process (step S210), a second heat treatment (step S211), silicon oxide film formation (step S212), a third heat treatment (step S213), a fourth heat treatment (step S214), gate electrode formation (step S215), interlayer insulating film formation (step S216), and source electrode and drain electrode formation (step S217).

In step S200, the silicon carbide layer 10 is prepared. The silicon carbide layer 10 includes an $n^+$-type drain region 12 and an $n^-$-type drift region 14.

In step S201, the first mask material is formed. Then, aluminum is ion-implanted into the drift region 14 by using the first mask material as an ion implantation mask. The p-well region 16 is formed by ion implantation.

Ion implantation for forming the p-well region 16 is an example of first ion implantation. Ion implantation of aluminum is performed in a first projected range and a first dose amount.

In step S202, carbon is ion-implanted into the p-well region 16 by using the first mask material as an ion implantation mask. Ion implantation of carbon into the p-well region 16 is an example of second ion implantation. Ion implantation of carbon is performed in a second projected range and a second dose amount. Thereafter, the first mask material is removed.

In step S203, the second mask material is formed. Then, the source region 18 is formed by ion-implanting phosphorus as an n-type impurity into the drift region 14 by using the second mask material as an ion implantation mask. Thereafter, the second mask material is removed.

In step S204, the third mask material is formed. The p-well contact region 20 is formed by ion-implanting aluminum as a p-type impurity into the drift region 14 by using the third mask material as an ion implantation mask. Thereafter, the third mask material is removed.

In step S205, a carbon film is formed on the silicon carbide layer 10.

In step S206, the first heat treatment is performed. The first heat treatment is performed at 1600° C. or more. The first heat treatment is performed in a non-oxidizing atmosphere. The first heat treatment is performed, for example, in an inert gas atmosphere. The first heat treatment is performed, for example, in an argon gas atmosphere.

By the first heat treatment, aluminum and phosphorus ion-implanted into the silicon carbide layer 10 are activated. The first heat treatment is activation annealing of aluminum and phosphorus.

In step S207, the carbon film is removed. The carbon film is removed by the ashing treatment using the oxygen plasma.

In step S208, the field oxide film is formed on the silicon carbide layer 10. The field oxide film contains oxygen. The field oxide film is, for example, a silicon oxide film. The field oxide film is deposited by, for example, a vapor phase growth method.

Subsequently, the field oxide film is removed.

In step S209, the sacrificial oxide film is formed on the silicon carbide layer 10. The sacrificial oxide film is, for example, a silicon oxide film. The sacrificial oxide film is formed by the thermal oxidation of the front surface of the silicon carbide layer.

Subsequently, the sacrificial oxide film is removed.

In step S210, the hydrogen etching process of etching the front surface of the silicon carbide layer 10 in an atmosphere containing hydrogen gas is performed. The front surface of the silicon carbide layer 10 is etched at a temperature, for example, equal to or more than 10 nm and equal to or less than 100 nm by the hydrogen etching process. The etching amount is preferably equal to or more than 15 nm, more preferably equal to or more than 25 nm, and still more preferably equal to or more than 50 nm. In the method for manufacturing a semiconductor device of the second embodiment, since an effect of the hydrogen etching process is not significantly changed even though etching of more than 100 nm is performed, the etching of more than 100 nm may not be required.

In step S211, the second heat treatment is performed. The second heat treatment is performed in an atmosphere containing ammonia gas ($NH_3$).

The interface termination region 40 is formed on the front surface of the silicon carbide layer 10 by the second heat treatment.

In step S212, the silicon oxide film is formed on the silicon carbide layer 10. The silicon oxide film finally becomes the gate insulating layer 28. The silicon oxide film is formed, for example, by a vapor phase growth method at a low temperature and a low oxygen partial pressure.

The silicon oxide film is preferably formed at a temperature of 600° C. or less, more preferably formed at a temperature of 500° C. or less, and still more preferably formed at a temperature of 450° C. or less. The silicon oxide film is formed at a low temperature, and thus, the oxidation of the front surface of the silicon carbide layer is suppressed.

The silicon oxide film formed in step S212 is preferably a silicon oxide film in which the entire film is rich in silicon by reducing the oxygen partial pressure during growth. $SiO_{2-\delta}$ is preferably $0.01 \leq \delta \leq 0.1$. That is, it is preferable to adjust oxygen deficiency to 0.5% or more and 5% or less. This is because, when extra oxygen is present in the silicon oxide film, the silicon carbide layer may be oxidized during a subsequent high-temperature treatment, and thus, it is preferable to set the silicon carbide layer to be in a state where there is no extra oxygen. The third heat treatment is performed, and thus, oxygen is supplied to oxygen deficiency in the silicon oxide film. Accordingly, a good silicon oxide film without oxygen deficiency is finally obtained.

In step S213, the third heat treatment is performed. The third heat treatment is performed in an atmosphere containing an inert gas. The second heat treatment is performed in a non-oxidizing atmosphere in which the front surface of the silicon carbide layer 10 is not oxidized.

For example, the heat treatment is performed by supplying argon gas (Ar) or nitrogen gas ($N_2$) to a reaction furnace containing the silicon carbide layer 10.

The temperature of the third heat treatment is, for example, equal to or more than 1000° C. and equal to or less than 1400° C.

The third heat treatment also functions as densify annealing of the silicon oxide film. By the third heat treatment, the silicon oxide film becomes a high-density film.

In step S214, the fourth heat treatment is performed. The fourth heat treatment is performed in an atmosphere containing nitrogen oxide gas (NOx). Nitrogen in the silicon oxide film is removed by the fourth heat treatment.

In step S215, the gate electrode 30 is formed on the gate insulating layer 28.

In step S216, the interlayer insulating film 32 is formed on the gate electrode 30.

In step S215, the source electrode 34 and the drain electrode 36 are formed.

The MOSFET 100 illustrated in FIG. 1 is formed by the above manufacturing method.

As described above, similarly to the first embodiment, according to the second embodiment, the amount of carbon vacancies in the silicon carbide layer is reduced, and thus, the method for manufacturing a semiconductor device capable of suppressing the decrease in the carrier mobility.

Third Embodiment

A method for manufacturing a semiconductor device of a third embodiment includes performing first ion implantation of implanting aluminum (Al) into a silicon carbide layer, performing a first heat treatment of 1600° C. or more, performing an oxidation treatment of oxidizing the silicon carbide layer, performing an etching process of etching the silicon carbide layer in an atmosphere containing a hydrogen gas by 25 nm or more, forming a silicon oxide film on the silicon carbide layer, and forming a gate electrode on the silicon oxide film. The method for manufacturing a semiconductor device of the third embodiment is different from the method for manufacturing a semiconductor device according to the first embodiment in that the second ion implantation of implanting carbon (C) into the silicon carbide layer is not provided. Hereinafter, a part of contents overlapping the contents of the first embodiment will not be described.

As illustrated in FIG. 21 of the first embodiment, when the ion implantation of carbon is not performed in addition to the ion implantation of aluminum and when the oxidation treatment is performed after the ion implantation, for example, the carbon vacancy density increases from the front surface of the silicon carbide layer to a region of 200 nm or more. It is considered that when the ion implantation of carbon is not performed, since the carbon vacancy density of the silicon carbide layer before the oxidation treatment is high, the diffusion of the oxygen through the carbon vacancies is promoted, and the distortion of the silicon carbide occurs up to a deep region of the silicon carbide layer.

In the method for manufacturing a semiconductor device of the third embodiment, after the oxidation treatment is performed on the silicon carbide layer 10, the front surface of the silicon carbide layer 10 is etched by the hydrogen etching process. The etching amount of the front surface of the silicon carbide layer 10 by the hydrogen etching process is equal to or more than 25 nm. The front surface of the silicon carbide layer 10 is etched by 25 nm or more, and thus, a region having a carbon vacancy density of $10^{16}$ cm$^{-3}$ or more is removed. The region having the high carbon vacancy density is removed, and thus, the carbon vacancy density on the front surface of the silicon carbide layer 10 is reduced. Accordingly, the amount of carbon vacancies in the p-well region 16 immediately below the gate insulating layer 28 is reduced. As a result, the hole mobility is, for example, equal to or more than 160 cm$^2$/V·s.

From the viewpoint of reducing the carbon vacancy density of the front surface of the silicon carbide layer 10, the etching amount of the front surface of the silicon carbide layer 10 by the hydrogen etching process is preferably equal to or more than 50 nm, more preferably equal to or more than 75 nm, and still more preferably equal to or more than 100 nm. The etching amount is most preferably equal to or more than 200 nm. When the etching amount is equal to or more than 50 nm, the hole mobility is, for example, equal to or more than 160 cm$^2$/V·s. When the etching amount is equal to or more than 200 nm, the hole mobility is, for example, equal to or more than 200 cm$^2$/V·s. Since there is a large amount of carbon vacancies up to the back, the carbon vacancies are removed from the front surface to the back by etching.

As described above, according to the third embodiment, the semiconductor device and the method for manufacturing a semiconductor device capable of suppressing the decrease in the carrier mobility are realized by reducing the amount of carbon vacancies in the silicon carbide layer.

Fourth Embodiment

A semiconductor device of a fourth embodiment is different from the semiconductor device of the first embodiment in that the semiconductor device is a trench gate type MOSFET including a gate electrode in a trench. Hereinafter, a part of contents overlapping with the contents of the first embodiment will not be described.

Figure 23:
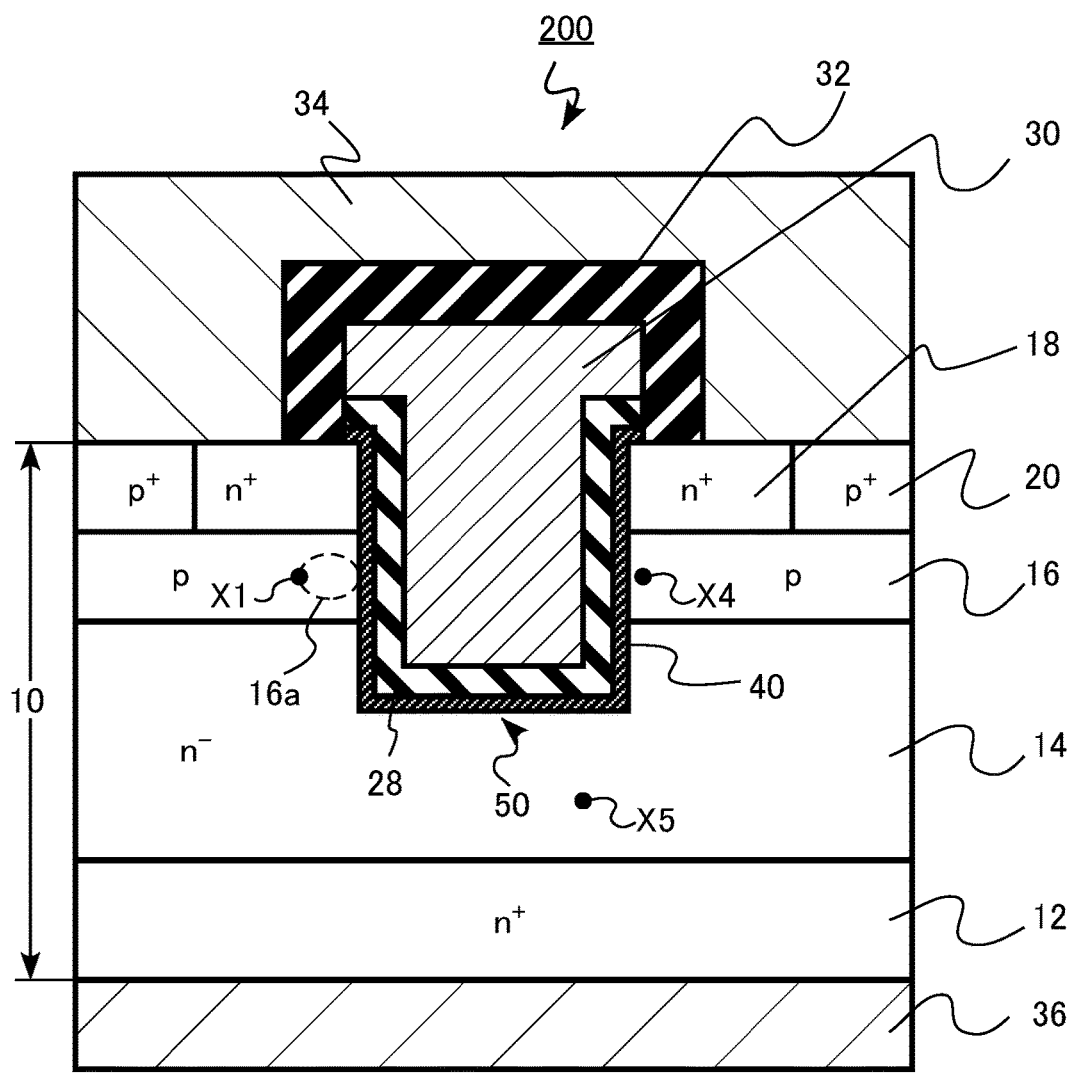
FIG. 23 is a schematic cross-sectional view of a semiconductor device of a fourth embodiment.

FIG. 23 is a schematic cross-sectional view of the semiconductor device of the fourth embodiment. The semiconductor device of the fourth embodiment is a MOSFET 200. The MOSFET 200 is the trench gate type MOSFET including the gate electrode is provided in the trench. The MOSFET 200 is an n-channel MOSFET using electrons as carriers.

The MOSFET 200 includes a silicon carbide layer 10, a gate insulating layer 28 (silicon oxide layer), a gate electrode 30, an interlayer insulating film 32, a source electrode 34, a drain electrode 36, an interface termination region 40 (region), and a trench 50.

The silicon carbide layer 10 includes a drain region 12, a drift region 14, a p-well region 16, a source region 18, and a p-well contact region 20.

The trench 50 penetrates the source region 18 and the p-well region 16 and reaches the drift region 14. A bottom surface of the trench 50 is disposed in the drift region 14.

The gate insulating layer 28 and the gate electrode 30 are provided in the trench 50. A side surface of the trench 50 is, for example, a face having an off angle of 0 degrees or more and 8 degrees or less with respect to the m-face.

The p-well region 16 contains, for example, aluminum (Al) as a p-type impurity. For example, a p-type impurity concentration of the p-well region 16 is equal to or more than $1 \times 10^{16}$ cm$^{-3}$ and is equal to or less than $1 \times 10^{20}$ cm$^{-3}$. Similarly to the manufacturing method of the first embodiment, as illustrated in FIG. 9 of the first embodiment, carbon is introduced by ion implantation so as to cover the distribution of aluminum.

For example, a depth of the p-well region 16 is equal to or more than 0.4 μm and is equal to or less than 0.8 μm. The p-well region 16 functions as a channel region of the MOSFET 200.

The channel portion 16a is disposed between the gate insulating layer 28 and the first position (X1 in FIG. 23) 100 nm away from the gate insulating layer 28 toward the silicon carbide layer 10. The channel portion 16a is disposed in the p-well region 16.

In the channel portion 16a, a ratio of the intensity of the infrared absorption at a wave number of 838 cm$^{-1}$, which is measured by the attenuated total reflection method (ATR method) in the Fourier transform infrared spectroscopy method (FTIR method), to the intensity of the infrared absorption at a wave number of 970 cm$^{-1}$ is equal to or less than 1.0.

In the channel portion 16a, the $Z_{1/2}$ level density measured by DLTS is equal to or less than $1 \times 10^{11}$ cm$^{-3}$. The $Z_{1/2}$ level density is preferably equal to or less than $5 \times 10^{10}$ cm$^{-3}$, and more preferably equal to or less than $1 \times 10^{10}$ cm$^{-3}$.

Hole mobility of electrons in the channel portion 16a is, for example, equal to or more than 200 cm$^2$/V·s. The hole mobility is preferably equal to or more than 350 cm$^2$/V·s, and more preferably equal to or more than 450 cm$^2$/V·s.

The interface termination region 40 is disposed between the silicon carbide layer 10 and the gate insulating layer 28. The interface termination region 40 is disposed between the drift region 14 and the p-well region 16, and the gate insulating layer 28. The interface termination region 40 contains nitrogen (N) as a termination element that terminates a dangling bond of the silicon carbide layer 10. The interface termination region 40 is an example of a region.

The nitrogen concentration in the interface termination region 40 is equal to or more than $1 \times 10^{21}$ cm$^{-3}$.

As illustrated in FIG. 3, the nitrogen concentration distribution has a peak in the interface termination region 40. A peak nitrogen concentration is, for example, equal to or more than $1 \times 10^{22}$ cm$^{-3}$. A full width at half maximum for a peak of the nitrogen concentration distribution is, for example, equal to or less than 1 nm. Nitrogen segregates at an interface between the silicon carbide layer 10 and the gate insulating layer 28.

The peak nitrogen concentration of the nitrogen concentration distribution is, for example, equal to or more than $1 \times 10^{22}$ cm$^{-3}$.

The nitrogen concentration at the second position X2 1 nm away from the peak of the nitrogen concentration distribution toward the gate insulating layer 28 is equal to or less than $1 \times 10^{18}$ cm$^{-3}$. The nitrogen concentration at the third position X3 1 nm away from the peak of the nitrogen concentration distribution toward the silicon carbide layer 10 is equal to or less than $1 \times 10^{18}$ cm$^{-3}$. The nitrogen concentration at the third position X3 is preferably equal to or less than $1 \times 10^{17}$ cm$^{-3}$, and more preferably equal to or less than $2 \times 10^{16}$ cm$^{-3}$.

The amount of nitrogen atoms bonded to four silicon atoms at the fourth position (X4 in FIG. 23) 5 nm away from the gate insulating layer 28 toward the silicon carbide layer 10 is, for example, equal to or more than 80% and equal to or less than 120% of the amount of nitrogen atoms bonded to four silicon atoms at the fifth position (X5 in FIG. 23) 5 μm away from the gate insulating layer 28 toward the silicon carbide layer 10. In other words, the amount of nitrogen atoms four-coordinated at the fourth position X4 is equal to or more than 80% and equal to or less than 120% of the amount of nitrogen atoms four-coordinated at the fifth position X5.

The fourth position X4 is disposed in the p-well region 16. The fifth position X5 is disposed in the drift region 14.

The MOSFET 200 can be manufactured, for example, by forming the trench 50 after the first heat treatment of the manufacturing method of the first embodiment and before the etching process.

As described above, similarly to the first, second, and third embodiments, according to the fourth embodiment, the semiconductor device capable of suppressing the decrease in the carrier mobility is realized by reducing the amount of carbon vacancies in the silicon carbide layer. Since the semiconductor device is the trench gate type, a channel density per unit area of a chip is increased, and an on-resistance of the MOSFET is reduced.

Fifth Embodiment

An inverter circuit and a drive device of a fifth embodiment are an inverter circuit and a drive device including the semiconductor device of the first embodiment.

Figure 24:
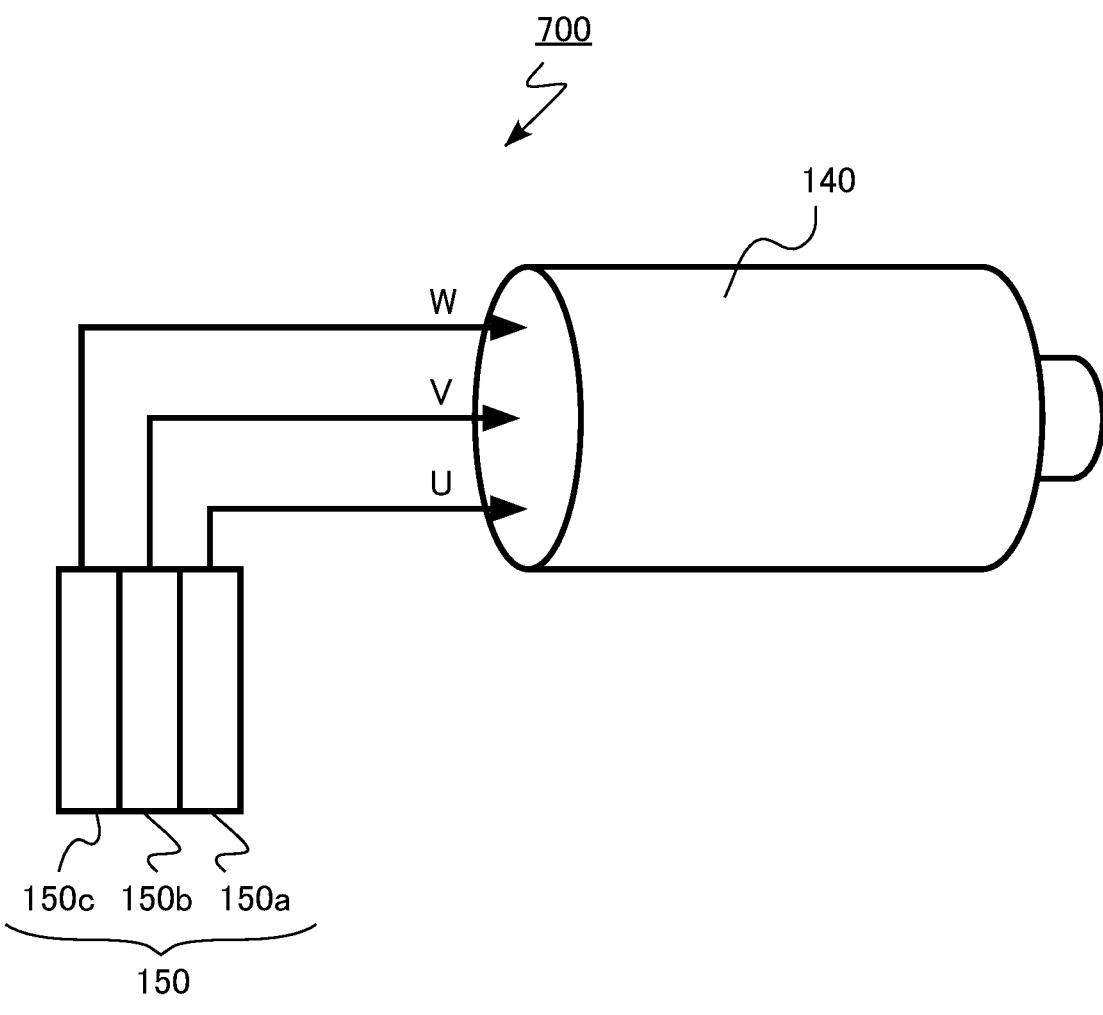
FIG. 24 is a schematic diagram of a drive device of a fifth embodiment.

FIG. 24 is a schematic diagram of the drive device of the fifth embodiment. A drive device 700 includes a motor 140 and an inverter circuit 150.

The inverter circuit 150 includes three semiconductor modules 150a, 150b, and 150c each using the MOSFET 100 of the first embodiment as a switching element. The three semiconductor modules 150a, 150b, and 150c are connected in parallel, and thus, a three-phase inverter circuit 150 including three AC voltage output terminals U, V, and W is realized. The motor 140 is driven by an AC voltage output from the inverter circuit 150.

According to the fifth embodiment, the MOSFET 100 having improved characteristics is included, and thus, characteristics of the inverter circuit 150 and the drive device 700 are improved.

Sixth Embodiment

A vehicle of a sixth embodiment is a vehicle including the semiconductor device of the first embodiment.

Figure 25:
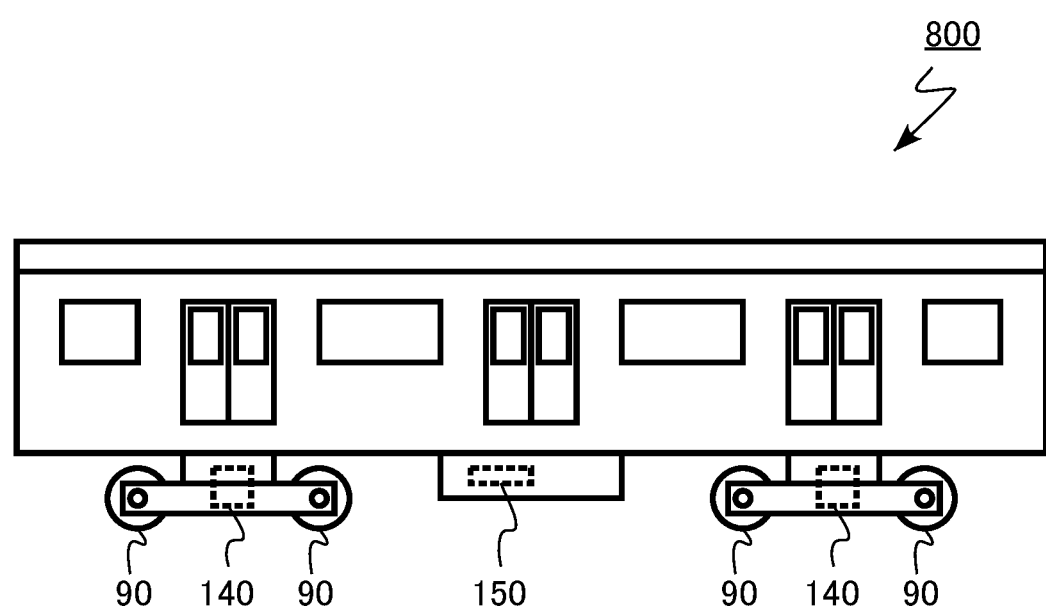
FIG. 25 is a schematic diagram of a vehicle of a sixth embodiment.

FIG. 25 is a schematic diagram of the vehicle of the sixth embodiment. A vehicle 800 of the sixth embodiment is a railway vehicle. The vehicle 800 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized. The motor 140 is driven by an AC voltage output from the inverter circuit 150. Wheels 90 of the vehicle 800 are rotated by the motor 140.

According to the sixth embodiment, the MOSFET 100 having improved characteristics is included, and thus, characteristics of the vehicle 800 are improved.

Seventh Embodiment

A vehicle of a seventh embodiment is a vehicle including the semiconductor device of the first embodiment.

Figure 26:
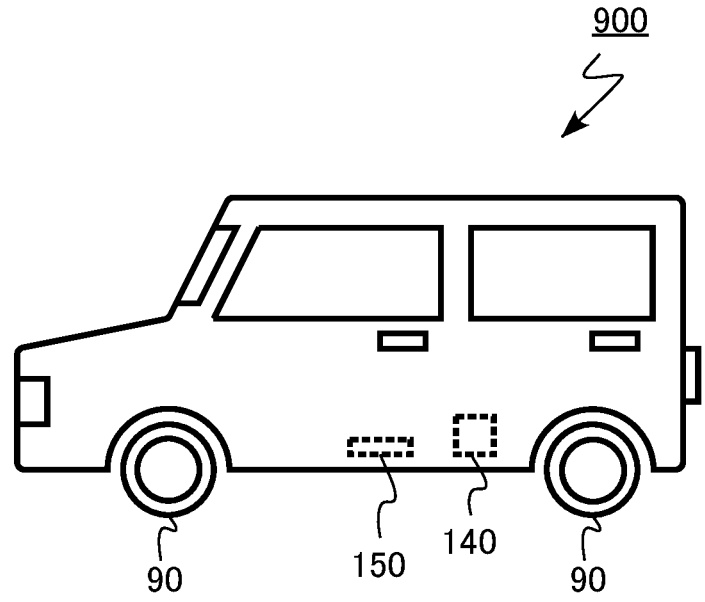
FIG. 26 is a schematic diagram of a vehicle of a seventh embodiment.

FIG. 26 is a schematic diagram of the vehicle of the seventh embodiment. A vehicle 900 of the seventh embodiment is an automobile. The vehicle 900 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. Wheels 90 of the vehicle 900 are rotated by the motor 140.

According to the seventh embodiment, the MOSFET 100 having improved characteristics is included, and thus, characteristics of the vehicle 900 are improved.

Eighth Embodiment

An elevator according to an eighth embodiment is an elevator including the semiconductor device of the first embodiment.

Figure 27:
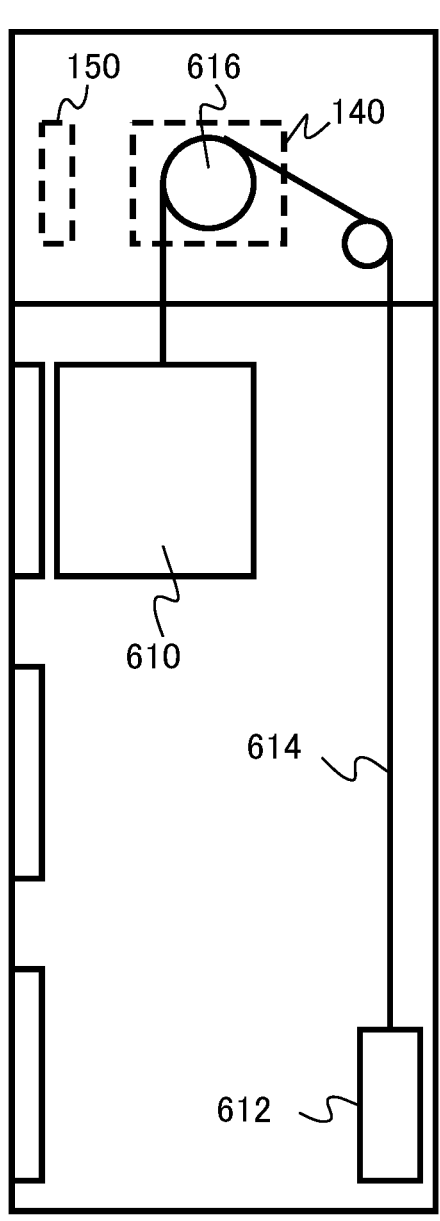
FIG. 27 is a schematic diagram of an elevator of an eighth embodiment.

FIG. 27 is a schematic diagram of the elevator of the eighth embodiment. An elevator 1000 of the eighth embodiment includes a car 610, a counterweight 612, a wire rope 614, a hoist 616, a motor 140, and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. The hoist 616 is rotated by the motor 140, and thus, the car 610 moves up.

According to the eighth embodiment, the MOSFET 100 having improved characteristics is included, and thus, characteristics of the elevator 1000 are improved.

Although it has been described in the first to fourth embodiments that 4H—SiC is used as the crystal structure of the silicon carbide, the present disclosure can be applied to silicon carbide having other crystal structures such as 6H—SiC and 3C—SiC.

In the first to fourth embodiments, although it has been described that the gate insulating layer 28 is provided on the silicon face or the m-face of the silicon carbide layer, the present disclosure can also be applied to a case where the gate insulating layer 28 is provided on other faces of the silicon carbide, for example, a carbon face, an a face, a (0-33-8) plane, and the like.

The present disclosure can also be applied to an n-channel insulated gate bipolar transistor (IGBT).

Although it has been described in the fifth to eighth embodiments that the semiconductor device of the present disclosure is applied to the vehicle or the elevator, the semiconductor device of the present disclosure can be applied to, for example, a power conditioner of a solar power generation system.

Although it has been described in the fifth to eighth embodiments that the semiconductor device of the first embodiment is applied, the semiconductor device of the second, third, or fourth embodiment can also be applied.

While certain embodiments have been described, these embodiments have been presented by way of example only, and are not intended to limit the scope of the inventions. Indeed, the method for manufacturing a semiconductor device, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:

performing first ion implantation of implanting aluminum (Al) into a first portion of a silicon carbide layer in a first projected range and a first dose amount, the silicon carbide layer including a first region and a second region, and the second region is formed on the first region by an epitaxial growth method;

performing second ion implantation of implanting carbon (C) into the first portion of the silicon carbide layer in a second projected range and a second dose amount, the second dose amount being equal to or more than 10 times the first dose amount, after performing the first ion implantation;

performing a first heat treatment of 1600° C. or more, after the performing the second ion implantation;

performing an oxidation treatment of oxidizing the silicon carbide layer, after the performing the first heat treatment;

performing an etching process of etching the silicon carbide layer in an atmosphere containing a hydrogen gas, after the performing the oxidation treatment;

forming a silicon oxide film on an etched surface of the silicon carbide layer, after the performing the etching process; and forming a gate electrode on the silicon oxide film, wherein the silicon carbide layer is etched by 10 nm or more during the etching process, a temperature of the etching process is equal to or more than 1300° C. and equal to or less than 1500° C., and none of nickel (Ni), palladium (Pd), and platinum (Pt) is implanted into the first portion.

2. The method for manufacturing a semiconductor device according to claim 1, wherein the silicon carbide layer is etched by 15 nm or more during the etching process.

3. The method for manufacturing a semiconductor device according to claim 1, wherein the silicon carbide layer is etched by 25 nm or more during the etching process.

4. The method for manufacturing a semiconductor device according to claim 1, further comprising:

forming a carbon film on the silicon carbide layer after the performing first ion implantation before the performing the first heat treatment, wherein the oxidation treatment is an ashing treatment of removing the carbon film in oxygen plasma.

5. The method for manufacturing a semiconductor device according to claim 1, wherein the oxidation treatment is a thermal oxidation treatment.

6. The method for manufacturing a semiconductor device according to claim 1, wherein the oxidation treatment is a deposition treatment of depositing an insulating film containing oxygen on the silicon carbide layer.

7. The method for manufacturing a semiconductor device according to claim 1, wherein the first dose amount is equal to or less than $1 \times 10^{14}$ cm$^{-2}$.

8. The method for manufacturing a semiconductor device according to claim 1, wherein the second dose amount is equal to or more than $1 \times 10^{15}$ cm$^{-2}$.

9. The method for manufacturing a semiconductor device according to claim 1, wherein the first projected range and the second projected range are equal to or less than 0.6 μm.

10. The method for manufacturing a semiconductor device according to claim 1, wherein the second projected range is equal to or more than 80% and equal to or less than 120% of the first projected range.

11. The method for manufacturing a semiconductor device according to claim 1, wherein the first ion implantation and the second ion implantation are performed in a same region of the silicon carbide layer.

12. The method for manufacturing a semiconductor device according to claim 1, further comprising:

performing a second heat treatment in an atmosphere containing nitrogen (N) before or after the forming the silicon oxide film, and before the forming the gate electrode.

* * * * *